(12) United States Patent
Kataoka et al.

(10) Patent No.: US 9,378,126 B2
(45) Date of Patent: Jun. 28, 2016

(54) DECOMPRESSION APPARATUS AND DECOMPRESSION METHOD

(71) Applicant: FUJITSU LIMITED, Kawasaki-shi, Kanagawa (JP)

(72) Inventors: Masahiro Kataoka, Tama (JP); Teruhiko Onishi, Mishima (JP); Hiroshi Masago, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 249 days.

(21) Appl. No.: 13/761,495

(22) Filed: Feb. 7, 2013

(65) Prior Publication Data

US 2013/0238865 A1 Sep. 12, 2013

(30) Foreign Application Priority Data

Mar. 6, 2012 (JP) .................................. 2012-049161

(51) Int. Cl.
*G06F 12/00* (2006.01)
*H03M 7/40* (2006.01)

(52) U.S. Cl.
CPC ............. *G06F 12/00* (2013.01); *H03M 7/4031* (2013.01)

(58) Field of Classification Search
CPC ... H03M 7/30; H03M 7/3088; H03M 7/3084; G06F 3/067; G06F 3/0605; G06F 3/0659
USPC ....................................................... 711/154
See application file for complete search history.

(56) References Cited

U.S. PATENT DOCUMENTS

| | | | |
|---|---|---|---|
| 6,292,115 B1* | 9/2001 | Heath | 341/87 |
| 2001/0031092 A1* | 10/2001 | Zeck et al. | 382/239 |
| 2003/0058873 A1* | 3/2003 | Geiger | H04L 49/351 370/401 |
| 2010/0322308 A1* | 12/2010 | Lee et al. | 375/240.03 |
| 2011/0109485 A1 | 5/2011 | Kataoka et al. | |
| 2012/0246399 A1* | 9/2012 | Nishi et al. | 711/103 |
| 2013/0091328 A1* | 4/2013 | Yoshihara et al. | 711/118 |

FOREIGN PATENT DOCUMENTS

| | | |
|---|---|---|
| JP | 5-324722 | 12/1993 |
| JP | 9-218877 | 8/1997 |
| JP | 2011-100320 | 5/2011 |

* cited by examiner

*Primary Examiner* — Charles Rones
*Assistant Examiner* — Nanci Wong
(74) *Attorney, Agent, or Firm* — Staas & Halsey LLP

(57) ABSTRACT

A decompression apparatus includes a memory configured to store a dictionary data including, in association with a compression code, a decompression symbol and address information indicating a position of flag information, which indicates whether the decompressed symbol is included in a block of decompressed data obtained by decompressing a block of compressed data or not, and a processor configured to execute a procedure, the procedure including accessing the dictionary data stored in the memory, obtaining, from the dictionary data, the decompressed symbol and the address information associated with the compressed symbol included in the block of compressed data, generating the decompressed data by using the obtained decompressed symbol, and updating the flag information stored at the position indicated by the obtained address information.

9 Claims, 24 Drawing Sheets

FIG. 4

|  |  | BLOCK NUMBER 1 2 3 4 5 ⋯ α |
|---|---|---|
| 1 GRAM | 0x 00 | 0 1 0 1 0 ⋯ 0 |
|  | 0x 01 | 1 1 0 0 0 ⋯ 0 |
|  | ⋮ |  |
|  | 0x FF | 0 0 1 0 0 ⋯ 1 |
| 2 GRAMS | 0x 00 00 | 0 1 0 1 0 ⋯ 0 |
|  | 0x 00 01 | 0 1 0 0 0 ⋯ 0 |
|  | ⋮ |  |
|  | 0x FF FF | 0 0 1 0 0 ⋯ 1 |
| 3 GRAMS | 0x 00 00 00 | 0 0 0 1 0 ⋯ 0 |
|  | 0x 00 00 01 | 0 1 0 0 0 ⋯ 0 |
|  | ⋮ |  |
|  | 0x FF FF FF | 0 0 0 0 0 ⋯ 1 |

FIG. 18

| SYMBOL | CODE LENGTH | CODE |
|---|---|---|
| 0x01 | 1 BIT | 0 |
| 0x02 | 2 BITS | 10 |
| 0x00 | 4 BITS | 1100 |
| 0x04 | 4 BITS | 1101 |
| 0x06 | 4 BITS | 1110 |
| 0x03 | 5 BITS | 11110 |
| 0x05 | 6 BITS | 111110 |
| 0x07 | 6 BITS | 111111 |

DECOMPRESSION APPARATUS AND DECOMPRESSION METHOD

CROSS-REFERENCE TO RELATED APPLICATIONS

This application is based upon and claims the benefit of priority of the prior Japanese Patent Application No. 2012-49161, filed on 6 Mar. 2012, the entire contents of which are incorporated herein by reference.

FIELD

The embodiments discussed herein are related to decompression technology.

BACKGROUND

When data is transmitted on a network or stored in a storage device, the data may be compressed by using a compression code to reduce the data amount. For example, according to a file format called ZIP, a Huffman code may be used as a compression code. Regarding the Huffman code, from among the symbols included in the original data (for example, a bit string of one character or one byte) a code of which the number of bits is small is assigned to a symbol that has a high appearance frequency and a code of which the number of bits is large is assigned to a symbol with a lower appearance frequency. To decompress the compressed data, dictionary data may be prepared to determine the original symbol (decoded symbol) based on the code.

A document retrieving method for text data that includes a specific character string (the number of characters may be one) from a document data group is used. For example, an electric book file that includes a key word specified by a user is retrieved from among a plurality of electric book files. In this case, when all the texts of the document data group are retrieved after a target character string is specified, a retrieval time may be long. Therefore, all the texts of the document data group are retrieved in advance, and an index may be generated to determine existence or non-existence of the character string. If the character string is specified, the retrieval time may be shortened by determining desired document data with reference to the index.

There is a proposal of a document retrieving method for retrieving a document by extracting a one-character component as a character included in each document and an adjacent character component indicating an adjacent character, generating a one-character component chart and an adjacent character component chart, and using the generated two charts. To decompress the compressed data, a compression decompression algorithm (dictionary algorithm) for sequentially decompressing a dictionary by using a decoded character string to decode the consequent code based on the decompressed dictionary. There is a proposal of a data compressing method for enabling keyword retrieval without decompressing a compressed file by generating a map group indicating whether each of the characters is included in the file as well as compressing the file. If the index is not added to the data, after obtaining the compressed data, an information processing device may generate an index to perform document retrieval of the data as a target. For example, after obtaining a compressed electric book file, an information terminal device may generate an index to retrieve a file that includes a keyword specified by a user from among the plurality of the electric book files.

For example, there is a method for generating an index. According to the method, after the decompression of the compressed data is completed, a flag corresponding to the symbol is searched from the index and then is updated for each symbol included in the decompressed data. However, according to the above-described method, the number of times of access to a storage device such as a Random Access Memory (RAM) in a process for generating an index is increased.

SUMMARY

According to an aspect of the invention, a decompression apparatus includes a memory configured to store a dictionary data including, in association with a compression code, a decompression symbol and address information indicating a position of flag information, which indicates whether the decompressed symbol is included in a block of decompressed data obtained by decompressing a block of compressed data or not, and a processor configured to execute a procedure, the procedure including accessing the dictionary data stored in the memory, obtaining, from the dictionary data, the decompressed symbol and the address information associated with the compressed symbol included in the block of compressed data, generating the decompressed data by using the obtained decompressed symbol, and updating the flag information stored at the position indicated by the obtained address information.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 4 illustrates a data structure example of an index;

FIG. 18 illustrates an example of a deformed Huffman tree;

DESCRIPTION OF THE EMBODIMENTS

The embodiments will be described below with reference to the diagrams.

[First Embodiment]

Figure 1:
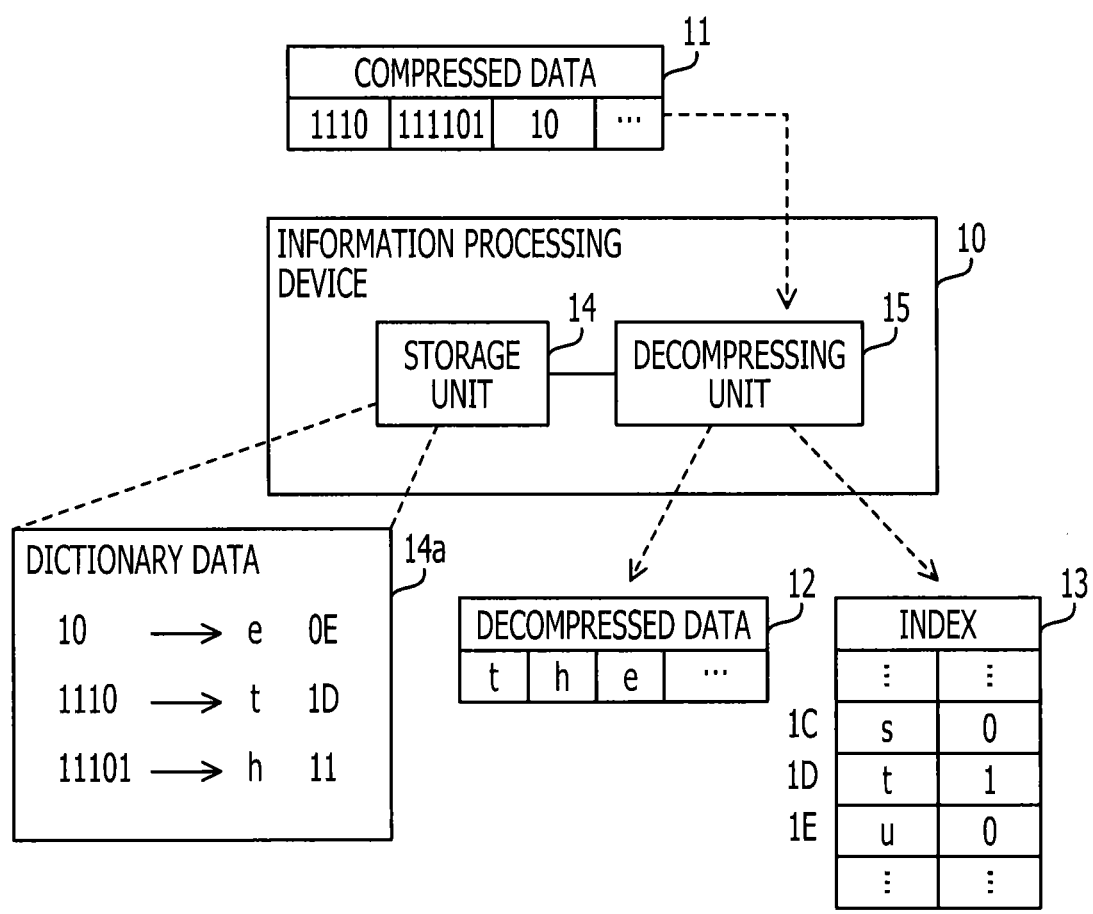
FIG. 1 illustrates an information processing device according to a first embodiment.

FIG. 1 is a diagram illustrating an information processing device according to a first embodiment.

An information processing device 10 generates a decompressed data 12 by decompressing a compressed data 11 and also generates an index 13 corresponding to the decompressed data 12. The compressed data 11 is, for example, a ZIP file that is compressed by using a Huffman code. The decompressed data 12 is, for example, a file of an electric book such as a digital novel, an academic book, and a dictionary. For example, the index 13 is used for full-text retrieval of the decompressed data 12. The information processing device 10 may be an information terminal device such as an electric book reader, an electric dictionary, and a mobile phone or a stationary device such as a desktop computer and a server computer.

The information processing device 10 includes a storage unit 14 and a decompressing unit 15. The storage unit 14 stores a dictionary data 14a that is referenced to decompress the compressed data. The storage unit 14 may be a volatile storage device such as a Random Access Memory (RAM) or a non-volatile storage device such as a flash memory and a Hard Disk Drive (HDD). The decompressing unit 15 decompresses the compressed data 11 with reference to the dictionary data 14a, and generates the decompressed data 12 and the index 13. The decompressing unit 15 may include a processor such as a Central Processing Unit (CPU) and a Digital Signal Processor (DSP) and an electronic circuit such as an Application Specific Integrated Circuit (ASIC) and a Field-Programmable Gate Array (FPGA). When the processing described below is achieved where the processor executes a program stored in a memory, the information processing device 10 may be referred to as a computer.

The index 13 includes flag information that corresponds to each of a plurality of symbols that may be included in the decompressed data 12 and indicates by the flag information whether the decompressed data 12 includes each of the symbols. The flag information corresponding to each of the symbols includes, for example, at least one flag indicating whether the symbol appears.

The flag is represented by 1 bit, for example. The flag is set to "1" if the symbol appears. The flag is set to "0" if the symbol does not appear. In association with the code used for the compression, the dictionary data 14a includes a symbol corresponding to the code and identification information used to identify the flag information corresponding to the symbol in the index 13. The dictionary data 14a may be generated by the decompressing unit 15 when the compressed data 11 is decompressed.

When decompressing the compressed data 11, the decompressing unit 15 obtains, from the dictionary data 14a, the symbol (decoded symbol) and the identification information included in association with the coded included in the compressed data 11. The decompressing unit 15 generates the decompressed data 12 by using the symbol obtained from the dictionary data 14a. For example, the decompressing unit 15 stores the obtained symbol in the end of a buffer that stores a symbol string as a decompression result. From among the flag information of the index 13, the decompressing unit 15 updates the flag information indicated by the identification information obtained from the dictionary data 14a. For example, the decompressing unit 15 sets the flag included in the flag information indicated by the identification information to "1."

For example, a decoded symbol t and an identification information 0x1D (29 in decimal) are registered in the dictionary data 14a in association with a code. When obtaining the code from the compressed data 11, the decompressing unit 15 adds the symbol t to the symbol string as the decompressed data 12 and also updates the flag information in the index 13 indicated by the identification information 0x1D. Since the identification information is registered in the dictionary data 14a, the decompressing unit 15 does not typically search the flag information corresponding to the symbol t in the index 13 by rereading the symbol t from the buffer that stores the decompression result.

Here, a "symbol" in the decompressed data 12 or the index 13 may be a single character or a bit string of one byte. When a single character is represented by two or more bytes, the character may be divided into a plurality of "symbols." The index 13 may include the flag information corresponding to the symbol string that includes N symbols (N is an integer that is two or more). The symbol string with N=2 may be referred to as bi-gram, and the symbol string with N=3 may be referred to as tri-gram. In this case, the decompressing unit 15 temporarily stores, for example, the identification information corresponding to the nearest N−1 symbols of which the decompression is completed in a storage device such as a memory. Based on combination of the identification information obtained from the dictionary data 14a and the identification information for stored N−1 symbols, the decompressing unit 15 specifies the flag information corresponding to the character string in the index 13.

The flag information corresponding to each symbol or character string may include a flag indicating whether the symbol or the symbol string is included in the data for each prescribed unit by which the decompressed data 12 is divided. For example, the prescribed unit is a block such as, a file, an item of the file, a prescribed length (for example, 256 bytes, 512 bytes, 1024 bytes, or the like). The decompressing unit 15 determines the type of the decompressed data 12 (for example, a novel, a dictionary, or the like) and selects the unit that forms the flag from among a plurality of units such as file, item, block, and the like. To form the flag for each block when the symbol string exists over two blocks, the decompressing unit 15 may update the flag information corresponding to the symbol string in such a way that the flag information indicates that each of the two blocks includes the symbol string.

According to the information processing device 10 of the first embodiment, since the identification information of the flag information corresponding to the decoded symbol is registered in the dictionary data 14a, the index 13 corresponding to the decompressed data 12 may be effectively generated while the decompressed data 12 is generated. That is, according to the method for searching the flag information to be updated in the index 13 after obtaining each symbol from the buffer that stores the decompression result, the access to a storage device such as a RAM that stores the decompressed data 12 or the index 13 is increased. On the contrary, the access to the storage device may be reduced by using the identification information registered in the dictionary data 14a and directly accessing desired flag information in the index 13. Since the index 13 corresponding to the decompressed data 12 when the decompression of the compressed data 11 is completed, the retrieval of the decompressed data 12 may start immediately.

[Second Embodiment]

Figure 2:
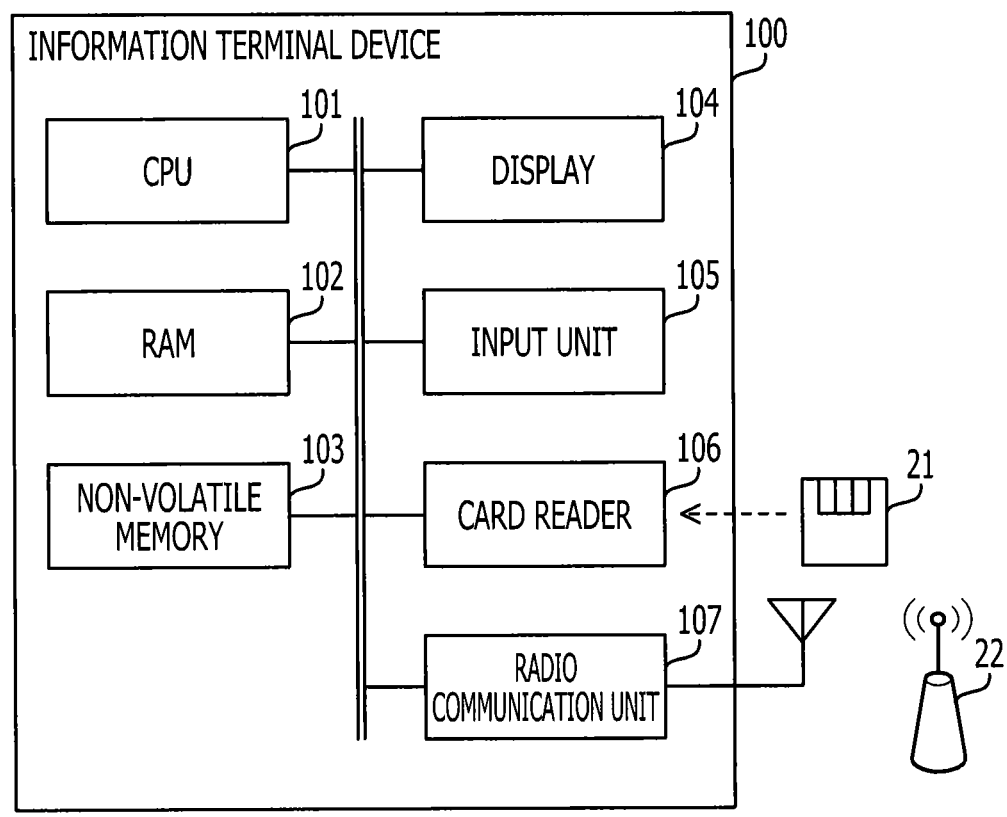
FIG. 2 is a block diagram illustrating a hardware example of an information terminal device.

FIG. 2 is a block diagram illustrating a hardware example of an information terminal device. An information terminal device 100 may display an electric book such as a digital novel, an academic book, and a dictionary according to user's operations. The electric book is distributed as a ZIP file that is compressed by using a Huffman code. The format of the electric book is, for example, Electronic Publication (EPUB), ever-Decompressing Mobile Document Format (XMDF), or the like that has been standardized by International Digital Publishing Forum (IDPF). The electric book file includes, for example, an Extensible Hyper-Text Markup Language (XHTML) file that has a text, a Cascading Style Sheets (CSS) file that defines the display method, and a Scalable Vector Graphics (SVG) file that represents a shape.

The information terminal device 100 includes a CPU 101, a RAM 102, a non-volatile memory 103, a display 104, an input unit 105, a card reader 106, and a radio communication unit 107. The information terminal device 100 is an example of the information processing device 10 according to the first embodiment. The RAM 102 and the non-volatile memory 103 are an example of the storage unit 14 according to the first embodiment, and the CPU 101 is an example of the decompressing unit 15 according to the first embodiment.

The CPU 101 is a processor that includes a calculator that executes an order of a program. The CPU 101 loads at least part of the program or data stored in the non-volatile memory 103 into the RAM 102 to execute the program. The CPU 101 may include a plurality of processor cores. The information terminal device 100 may include a plurality of processors. The processing described below may be performed in parallel by using the plurality of processor cores or processors.

The RAM 102 is a volatile memory that temporally stores the program to be executed by the CPU 101 and the data used in information processing. The information terminal device 100 may include a different type of memory other than the RAM and include a plurality of memories.

The non-volatile memory 103 is a storage device that stores programs of software such as an Operation System (OS), firmware, and application software and stores data such as a ZIP file. The non-volatile memory 103 is, for example, a flash memory. The information terminal device 100 may include another type of non-volatile storage device such as an HDD and include a plurality of non-volatile storage devices.

In response to the order from the CPU 101, the display 104 displays an operation screen for selecting an electric book, the data of the selected electric book, and the like. For example, a Liquid Crystal Display (LCD) or an organic Electro-Luminescence (EL) display may be employed as the display 104.

The input unit 105 detects an input operation of the user and then outputs an input signal indicating a pressed button or a touch position to the CPU 101. For example, a keypad with one or more buttons, a touch panel that may detect a touch position, and the like may be employed as the input unit 105. The information terminal device 100 may include different types of input devices.

The card reader 106 is a drive device (drive) that reads out the program or data recorded in a recording medium 21 as a card-type portable recording medium. In response to the order from the CPU 101, the card reader 106 stores the program or data read out from the recording medium 21 in the RAM 102 or the non-volatile memory 103. The recording medium 21 is, for example, a non-volatile semiconductor memory such as a micro Secure Digital (SD) and a flash memory. The information terminal device 100 may include a disk drive that reads out the program or data recorded in a disk-type portable recording medium. In this case, for example, a magnetic disk such as a Flexible Disk (FD), an optical disk such as a Compact Disc (CD) and a Digital Versatile Disc (DVD), a Magneto-Optical disk (MO), or the like may be employed as the recording medium 21.

The radio communication unit 107 is a communication interface that performs radio communication by being coupled to a radio access network such as a mobile phone network and a radio Local Area Network (LAN). The radio communication unit 107 performs the radio communication with an access point 22 (may be referred to as a base station) that belongs to the radio access network. The radio communication unit 107 receives the program or data from the server computer through the access point 22 and then stores the program or data in the RAM 102 or the non-volatile memory 103. The information terminal device 100 may include a wired communication interface.

The information terminal device 100 stores the ZIP file that is recorded in the recording medium 21 or the ZIP file that is distributed through the network, as an electric book, in the non-volatile memory 103. The information terminal device 100 loads the ZIP file specified by a user from the non-volatile memory 103 into the RAM 102, decompresss the ZIP file on the RAM 102, and then displays the decompressed data on the display 104. Regarding the ZIP file as an electric book, the duplication may be limited by Digital Rights Management (DRM). The information terminal device 100 decompresss the ZIP file every time the data of the electric book is displayed on the display 104. It is preferable that the decompressed data is not stored in the non-volatile memory 103.

Figure 3:
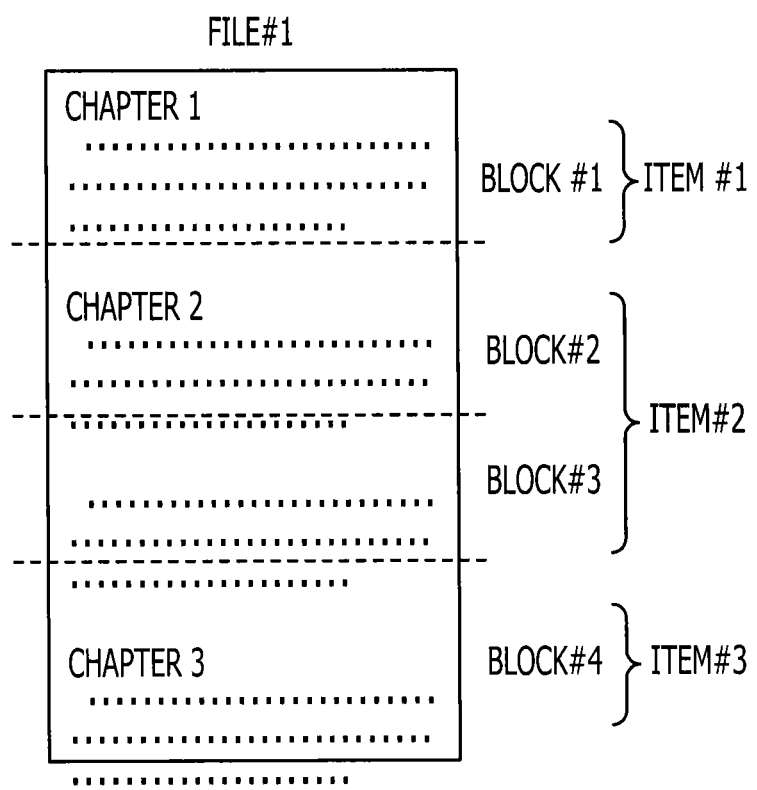
FIG. 3 illustrates a relationship among a file, an item, and a block.

FIG. 3 is a diagram illustrating a relationship among a file, an item, a block. The non-volatile memory 103 may store a plurality of compressed ZIP files. A text file (for example, an XHTML file) obtained by decompressing each of the ZIP files may include a plurality of items. The item corresponds to a single chapter or section of a novel or an academic book as an electric book or to description for a single direction word in a digital dictionary. The decompressed text file may be divided into blocks of a prescribed number of bytes (for example, 256 bytes, 512 bytes, 1024 bytes, or the like). A single item (for example, a large-size item) may include a plurality of blocks.

FIG. 4 is a diagram illustrating a data structure example of the index. The information terminal device 100 generates an index and stores the index file in the non-volatile memory 103 in such a way that a file, an item, or a block that may include a keyword that the user inputs may be retrieved. By using the index file stored in the non-volatile memory 103, the information terminal device 100 may narrow the ZIP files to be decompressed before decompressing each of the ZIP files. A single index file may be generated for each ZIP file or may include indexes for a plurality of ZIP files.

The index includes a bit map for a symbol of 1 gram (uni-gram) that may appear in the decompressed file, a symbol string of 2 grams (bi-gram), and a symbol string of 3 grams (tri-gram). According to the second embodiment, a 1-byte symbol is considered as "symbol." Each symbol has a value in a range starting from 0x00 until 0xFF (0 to 255 in decimal). The index includes at most 256 bit maps regarding 1 gram, 65536 bit maps regarding 2 grams, and 16777216 bit maps regarding 3 grams.

The bit map of 1 gram is identified by a bit map ID. For example, when the bit map ID is used as an offset from the beginning of the area in which the bit map of 1 gram is stored, an address indicating the position of the bit map is calculated. The bit map of 2 grams is identified by the combination of two bit map IDs regarding 1 gram. For example, the bit map corresponding to the symbol string 0x0001 is identified by the combination of the bit map ID of the symbol 0x00 and the bit map ID of the symbol 0x01. For example, when the value obtained by combining two bit map IDs is used as an offset from the beginning of the area in which the bit map of 2 grams is stored, an address is calculated. The bit map of 3 grams is identified by the combination of three bit map IDs regarding 1 gram.

Each of the bit maps includes a plurality of bits corresponding to a plurality of units (file, item, or block). Bit=1 indicates that the symbol or the symbol string appears, and bit=0 indicates that neither the symbol nor the symbol string appears. The bit map according to the second embodiment is an example of the flag information described in the first embodiment. As illustrated in FIG. 4, according to the second embodiment, the bit map includes a bit corresponding to each block.

Figure 5:
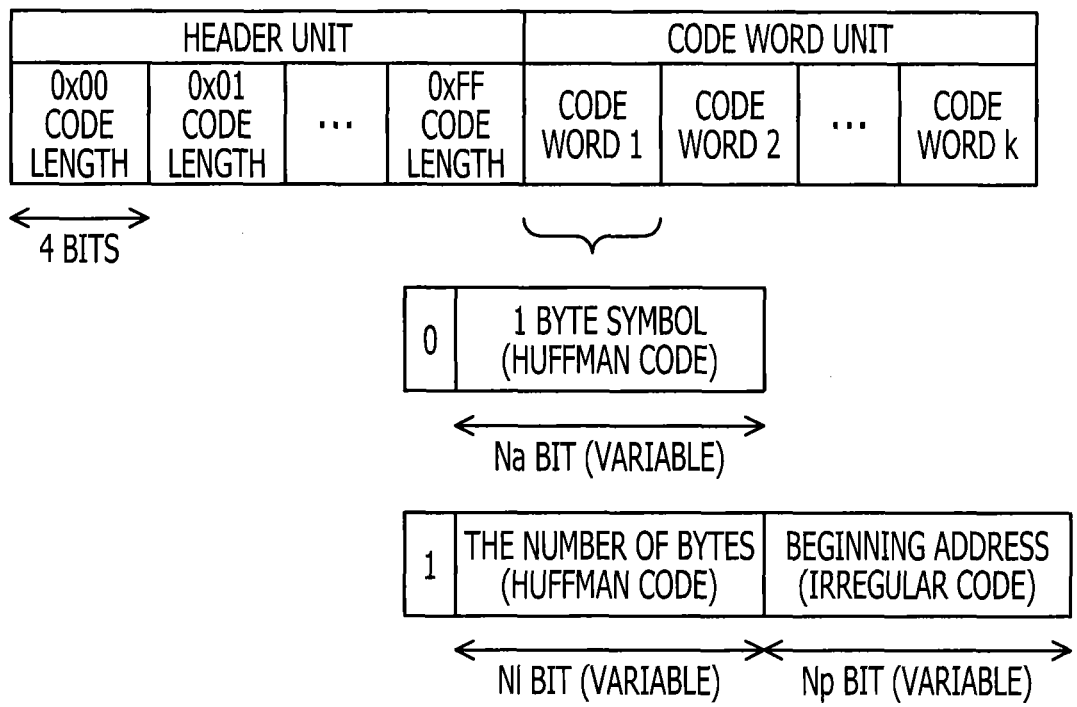
FIG. 5 illustrates a data structure example of a compressed file.

FIG. 5 is a diagram illustrating a data structure example of a compressed file. Regarding the compression and decompression according to the second embodiment, the symbol of 1 byte (8 bits) is handled as the smallest unit, and each symbol is handled as a value in the range from 0x00 until 0xFF. The character represented by a plurality of bytes such as a 2-byte character or a 3-byte character is handled as a string of a plurality of 1-byte symbols and is not handled by character unit.

To compress the ZIP file, a lossless compression algorithm obtained by combining an LZ77 algorithm and Huffman coding is used. To compress the data, the processing described below is performed by using the symbol string of the sliding window of 64k bytes (or a prescribed number of bytes). The appearance frequency of each symbol of 0x00 to 0xFF in the symbol string of 64 k bytes, and a Huffman tree is generated to determine a code corresponding to each symbol. The compression is performed from the beginning of the symbol string of 64k bytes toward the end thereof.

If the symbol string has the currently-focused symbol in the beginning thereof and if the symbol string of 3 or more bytes already appears, the symbol string is converted into "the number of bytes" of the corresponding symbol string and "beginning address" of the similar symbol string that appears earlier. The number of bytes is subjected to the Huffman coding according to the generated Huffman tree. The beginning address is divided into a numeral value indicating a digit, in which bit=1 first appears counted from a Most Significant Bit (MSB), and a bit string that is left behind the digit, and a numeral value indicating the digit is subjected to the Huffman coding to be combined with the left bit string. On the other hand, if the symbol string having the currently-focused symbol in the beginning thereof does not meet the above-described condition, the currently-focused 1 byte symbol is subjected to the Huffman coding. The compression algorithm is described in the following book: Uematsu, Tomohiko. 1994. 'Introduction to the Algorithm for Document Data Compression'.

The ZIP file obtained by the information terminal device 100 includes compressed data with the structure as illustrated in FIG. 5 generated for each symbol string of 64 k bytes before the compression. The compressed data includes a header unit and a code word unit. As for the Huffman coding, the header unit indicates the number of bits of the code to which each symbol of 256 patterns from 0x00 to 0xFF is coded. The length of each code is not less than 1 bit and not more than 16 bits, and the code length is 4 bits. Based on the header unit, the information terminal device 100 may reproduce the Huffman tree that is used for the compression.

The code word unit includes a plurality of code words. The first bit of each code word is a bit for control. The code word following the first bit=0 includes a Huffman-coded 1-byte symbol. The length of the Huffman-coded 1 byte symbol is variable (Na bit) and is not less than 1 bit but not more than 16 bits. The code word following the first bit=0 is extracted according to the Huffman tree and is decoded by being converted into a 1-byte symbol. The code word following the first bit=1 includes the number of bytes subjected to the Huffman coding and the beginning address that performs the above-described irregular coding. The length of the number of bytes subjected to the Huffman coding is a variable length (Nl bit), and the beginning address subjected to the coding is a variable length (Np bit). A symbol string of three or more bytes may be decoded from the code word following the first bit=1 by decoding according to the Huffman tree and duplicating from the preceding symbol string that is subjected to the decompression.

Figure 6:
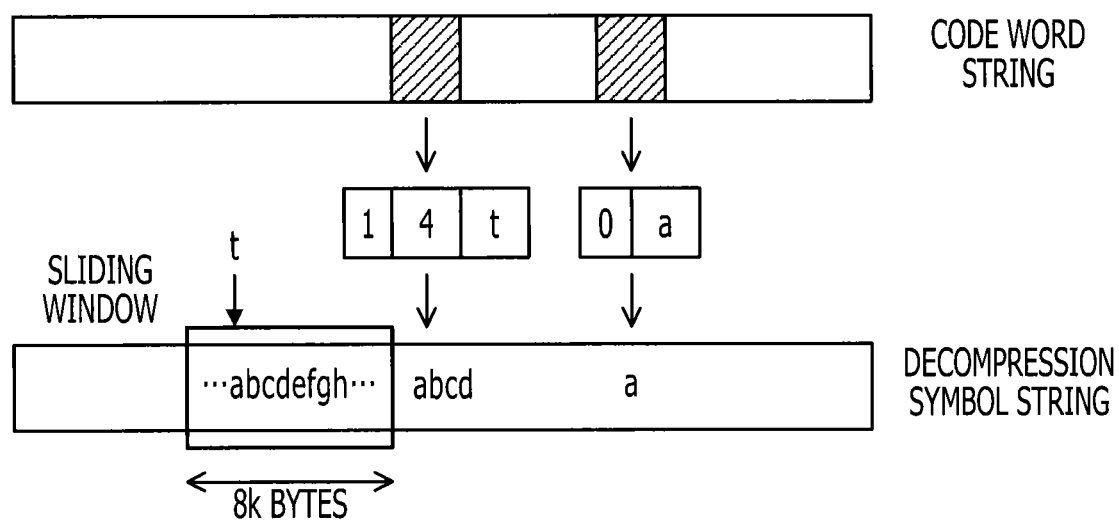
FIG. 6 illustrates a decompression example using a sliding window.

FIG. 6 is a diagram illustrating a decompression example of the compressed file using a sliding window. When decompressing the compressed data in the ZIP file, the information terminal device 100 secures, in the RAM 102, the buffer that stored the string of code words included in the code word unit and the buffer that stores the decompressed symbol string. The information terminal device 100 handles the nearest symbol string of 8k bytes (or a prescribed length such as 2k bytes or 4k bytes) from among the decompressed symbol strings as a symbol string included in the sliding window. The above-described "beginning address" indicates the position in the sliding window.

If the first bit of the code word is equal to 1, the information terminal device 100 decodes "the number of bytes" following the first bit and also decodes the "beginning address" following the number of bytes. The information terminal device 100 specifies the range in the sliding window based on the beginning address and the number of bytes and duplicates the symbol string in the specified range in the end of the buffer that stores the decompressed symbol string. For example, the sliding window includes the symbol string of abcdefgh, etc. from the position indicated by the beginning address toward the end thereof, and the symbol string abcd is added to the end of the buffer if the number of bytes is equal to 4. On the other hand, if the first bit of the code word is equal to 0, the information terminal device 100 decodes the 1-byte symbol following the first bit and then adds the 1-byte symbol to the end of the buffer. After that, the information terminal device 100 shifts the sliding window backward to the number of symbols added to the buffer.

Figure 7:
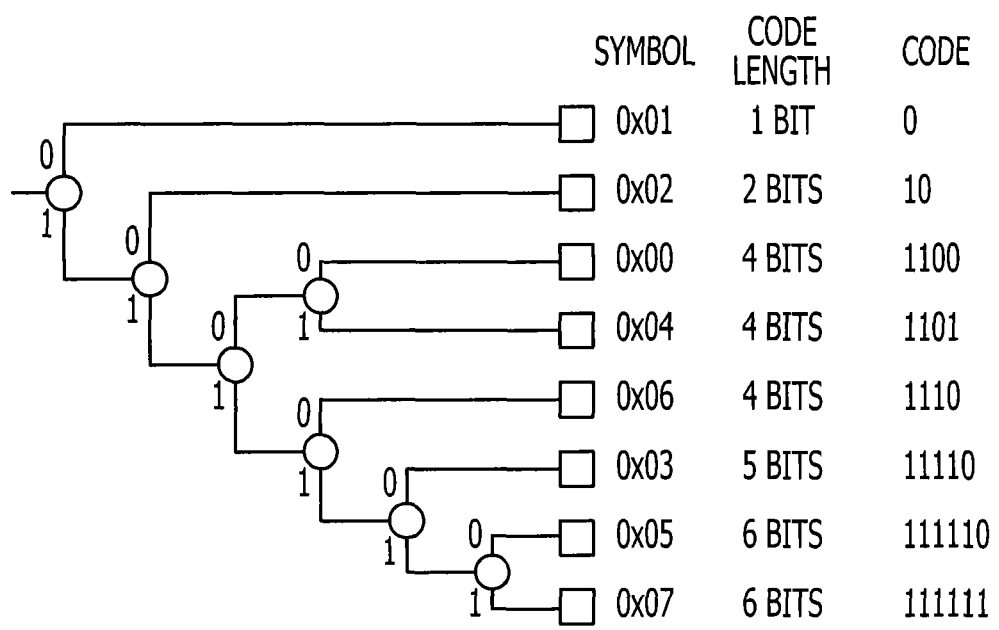
FIG. 7 illustrates an example of a binary Huffman tree.

FIG. 7 is a diagram illustrating an example of a binary Huffman tree. Based on the code length of each of the plurality of symbols described in the header unit of the ZIP file, the information terminal device 100 reproduces a binary Huffman tree used for the compression. The example of the Huffman tree illustrated in FIG. 7 includes a case where eight patterns, that is, the symbols 0x00 to 0x07 are included in the original data for simple description.

The information terminal device 100 arranges the symbols 0x00 to 0xFF (0x00 to 0x07 in the example illustrated in FIG.

7) in ascending order of the code length in the Huffman coding. A plurality of symbols with the similar code length is arranged in ascending order of the numeral value. For example, the symbol 0x01 has code length=1, the symbol 0x02 has code length=2, the symbols 0x00, 0x04, and 0x06 have code length=4, the symbol 0x03 has code length=5, and the symbols 0x05 and 0x07 have code length=6. In this case, eight symbols are arranged in an order of: 0x01, 0x02, 0x03, 0x04, 0x06, 0x03, 0x05, and 0x07.

The information terminal device 100 estimates the appearance frequency of each symbol based on the code length. The appearance frequency (probability of appearance) may be calculated as $\frac{1}{2}^L$ if the code length is L. The information terminal device 100 maintains the order of the symbols arranged as described above and generates a Huffman tree based on the appearance frequency of each symbol. That is, the information terminal device 100 repeats generation of a leaf node corresponding to each of the symbols and the generation of a new intermediate node by selecting two nodes (a leaf node or an intermediate node) in ascending order of the appearance frequency. For example, in the example illustrated in FIG. 7, the information terminal device 100 generates an intermediate node of which the appearance possibility is $\frac{1}{2}^5$ by combining two leaf nodes (0x05, 0x07) of which the appearance frequency is $\frac{1}{2}^6$ and combines the intermediate node and the leaf node (0x03) of which the appearance possibility is $\frac{1}{2}^5$.

In this manner, a Huffman tree is generated in such a way that the leaf node on the left side (the upper side in FIG. 7) is less deep and the leaf node on the right side (the lower side in FIG. 7) is deeper. The information terminal device 100 assigns "0" to the branch on the left side and assigns "1" to the branch on the right side at each branch (or the opposite assignment is performed). By tracing the branch toward each leaf node from the route node, the information terminal device 100 may determine a code at the coding of each symbol. For example, the symbol 0x00 is associated with a code 0, and the symbol 0x02 is associated with a code 10. As described above, by agreeing with the device performing the compression on a rule for arranging a plurality of symbols in ascending order of the code length and arranging the symbols with the similar code lengths in ascending order of the numeral value, the information terminal device 100 may uniquely generate the Huffman tree based on the code length of each symbol.

Figure 8:
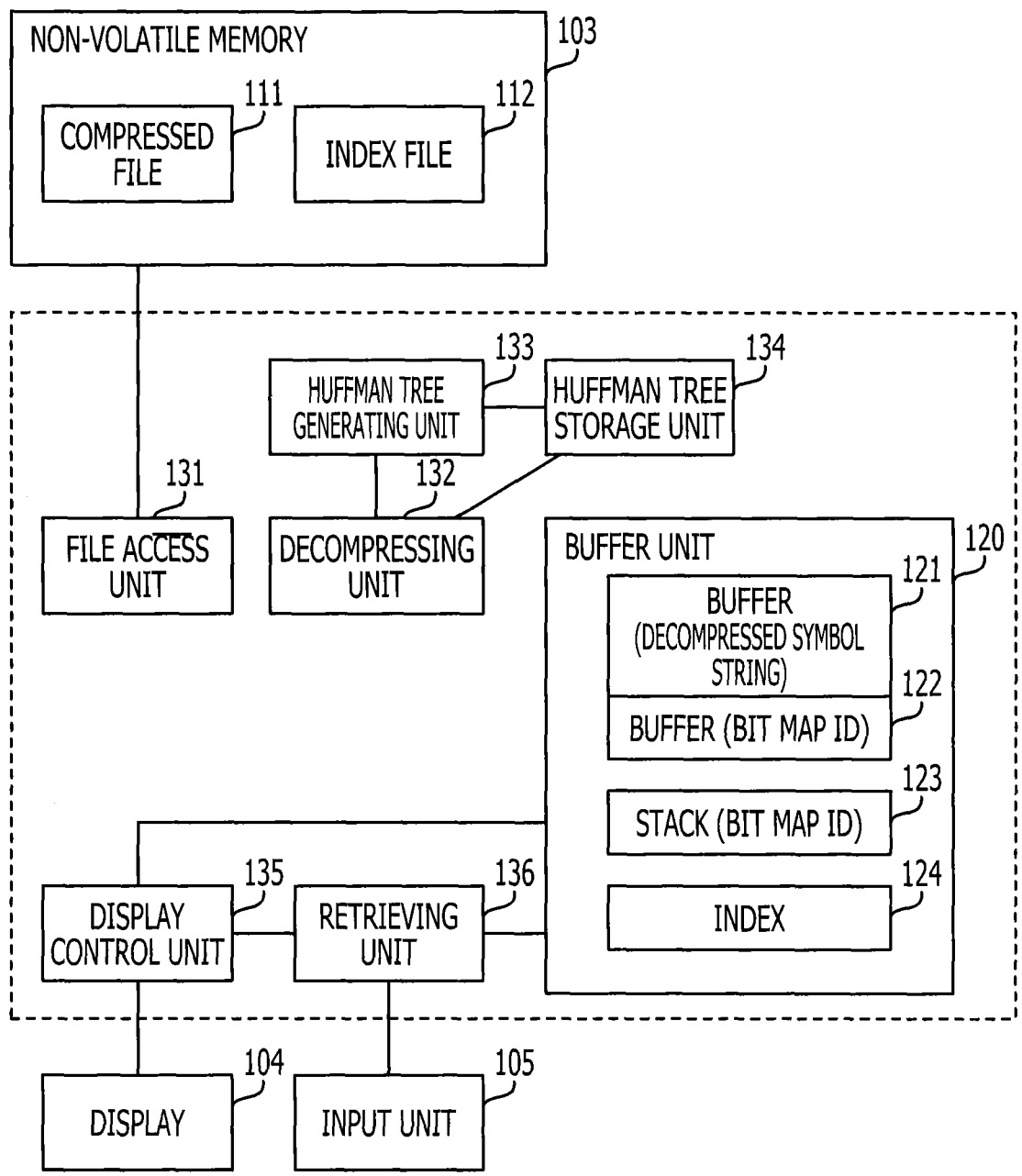
FIG. 8 is a block diagram illustrating an example of the information terminal device.

FIG. 8 is a block diagram illustrating a software example that operates in the information terminal device. The non-volatile memory 103 stores a compressed file 111 and an index file 112. The information terminal device 100 includes a buffer unit 120, a file access unit 131, a decompressing unit 132, a Huffman tree generating unit 133, a Huffman tree storage unit 134, a display control unit 135, and a retrieving unit 136. For example, the buffer unit 120 and the Huffman tree storage unit 134 are achieved as a storage area that is secured in the RAM 102. The file access unit 131, the decompressing unit 132, the Huffman tree generating unit 133, the display control unit 135, and the retrieving unit 136 are achieved as, for example, a module of the program that is loaded into the RAM 102 and executed by the CPU 101.

The compressed file 111 is a ZIP file as an electric book that is compressed by using the Huffman code. The compressed file 111 is loaded by the recording medium 21 or received from the access point 22 and is then stored in the non-volatile memory 103. The index file 112 includes an index regarding one or more compressed files that include the compressed file 111. The index regarding the compressed file 111 is generated when the compressed file 111 is first decompressed. Then, the index regarding the compressed file 111 is registered in the index file 112.

The buffer unit 120 includes buffers 121 and 122, a stack 123, and an index 124. The buffer 121 is a storage area of 64k bytes that temporally stores a symbol string as a decompression result. The buffer 122 is a storage area that stores a bit map ID corresponding to each of the symbols stored in the buffer 121. The stack 123 is a storage area that stores a bit map ID (the bit map ID corresponding to the preceding symbol) stored in the end of the buffer 122 and a bit map ID (the bit map ID corresponding to the second preceding symbol) stored in the second bit from the end of the buffer 122. The index 124, which is a set of the bit maps with the configuration illustrated in FIG. 4, is registered in the index file 112.

When an electric book is selected by user's input operation, the file access unit 131 reads the compressed file 111 corresponding to the selected electric book from the non-volatile memory 103 and then gives the compressed file 111 to the decompressing unit 132. The decompression of the compressed file 111 may be started after the entire compressed file 111 is loaded into the RAM 102 and may be started with respect to a loaded part before the reading is not completed. The file access unit 131 registers the index 124 generated by the decompressing unit 132 in the index file 112.

The decompressing unit 132 performs decompressing processing where a pair of header units and the code word unit included in the compressed file 111 as a unit. The decompressing unit 132 reports the code length of each of the symbols described in the header unit to the Huffman tree generating unit 133 and then instructs the generation of the structure data of the Huffman tree. The decompressing unit 132 refers to the structure of the Huffman tree stored in the Huffman tree storage unit 134, decompresses a plurality of code words included in the code word unit in order from the beginning thereof, and stores the decompressed symbol in the buffer 121. The decompressing unit 132 controls the position of the sliding window by following the process of the decompression.

The decompressing unit 132 updates the bit map of the index 124 every time the symbol is decompressed from the compressed file 111. The decompressing unit 132 determines a bit map ID corresponding to the symbol decompressed this time and then updates the bit map of 1 bit that is specified by the bit map ID. The decompressing unit 132 updates the bit map of 2 grams that is specified by the bit map ID and the preceding bit map ID stored in the stack 123. The decompressing unit 132 updates the bit map of 3 grams specified by this bit map ID, the preceding bit map ID, and the second preceding bit map ID stored in the stack 123. The decompressing unit 132 stores this bit map ID in the buffer 122 and rewrites the preceding bit map ID and the bit map ID two bit map IDs before stored in the stack 123.

The Huffman tree generating unit 133 obtains the information of the code length obtained by coding each of the symbols 0x00 to 0xFF from the decompressing unit 132, rearranges the plurality of symbols based on the code length, and generates the Huffman tree with the configuration illustrated in FIG. 7. The Huffman tree generating unit 133 stores, in the Huffman tree storage unit 134, the structure data forming the generated Huffman tree.

The Huffman tree storage unit 134 stores the structure data of the Huffman tree generated by the Huffman tree generating unit 133. The structure data of the Huffman tree may be updated every time the symbol string of 64 k bytes is decompressed. As described below, the structure data includes the symbol that decodes the code and the bit map ID corresponding to the symbol in association with the code used for the compression. The decompressing unit 132 extracts the bit string from the code word unit of the compressed file 111 and then obtains, from the structure data, the symbol and the bit map ID in association with the extracted bit string (code).

The display control unit 135 obtains, from the buffer 121, the symbol string of 64k bytes that is subjected to the decompression. For example, the display control unit 135 moves the symbol string stored in the buffer 121 to another storage area in the RAM 102 every time the buffer 121 is full. When completing the decompression of the compressed file 111, the display control unit 135 generates a display screen of an electric book from the decompressed data and then displays the display screen on the display 104. For example, based on the XHTML file or the SVG file included in the decompressed data, the display control unit 135 renders a page having a text and a shape and then displays the contents of the electric book on the display 104 by page unit.

The retrieving unit 136 obtains the keyword that is input by the user using the input unit 105, refers to the index 124, and retrieves a block that may include the keyword. The retrieving unit 136 instructs the display control unit 135 to display the page having the retrieved block. As described above, however, the unit for the retrieval may be an item or a file.

An example of the method for retrieving a block by using the bit map of 1 gram, 2 grams, or 3 grams will be described below. The retrieving unit 136 divides the input keyword into strings of successive characters of the similar type (a string may include one character). A character represented by 1 byte such as an alphanumeric character, a character represented by 2 bytes, a character represented by 3 bytes, and a character represented by 4 bytes are given as an example of the types of character. The retrieving unit 136 generates one of 1 gram from the character string formed with a 1-byte character, one of 2 grams from the character string formed with two 1-byte characters, and s−2 of 3 grams formed with s 1-byte character (s is an integer that is 3 or more). The retrieving unit 136 generates 2 grams for each character from the character string formed with a 2-byte character, 3 grams for each character from the character string formed with a 3-byte character, and two of 2 grams for each character from the character string formed with a 4-byte character.

The retrieving unit 136 obtains the bit map corresponding to the 1 gram, the 2 grams, and the 3 grams generated by the keyword from the index 124 and calculates AND of each bit among the plurality of bit maps. The retrieving unit 136 determines that the block with bit=1 indicated in the result of the AND is a block that may include the keyword. The above-described retrieving method is an example. The method of using the bit map of 1 gram, 2 gram, and 3 gram included in the index 124 is not limited to the example.

When decompressing the compressed file 111, the decompressing unit 132 may generate the index 124 corresponding to the compressed file 111 and register the index 124 in the index file 112. For example, when decompressing the compressed file 111, the decompressing unit 132 confirms whether the index corresponding to the compressed file 111 is already registered in the index file 112. If the index is registered, the decompressing unit 132 does not generally generate the index 124. The compressed file 111 is an example of the compressed data 11 according to the first embodiment. The index 124 is an example of the index 13 according to the first embodiment. The structure data stored in the Huffman tree storage unit 134 is an example of a dictionary data 14a stored in the storage unit 14 according to the first embodiment.

Figure 9:
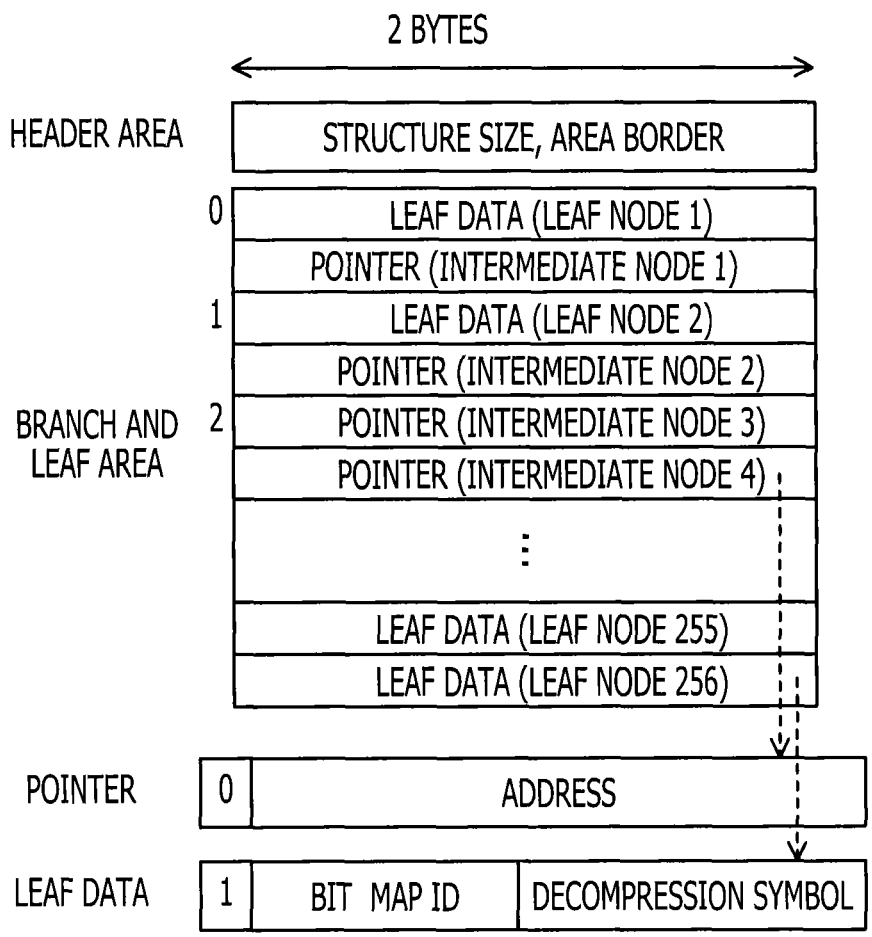
FIG. 9 illustrates a first example of a structure data forming a Huffman tree.

FIG. 9 is a diagram illustrating a first example of a structure data forming a Huffman tree. The structure data illustrated in FIG. 9 is generated by the Huffman tree generating unit 133 and is then stored in the Huffman tree storage unit 134. One row illustrated in FIG. 9 corresponds to a storage area of two bytes.

The structure data of the Huffman tree includes a header area and a branch and leaf area. The header area stores information for management such as the size of the structure data and the header address of the branch and leaf area. Regarding each of the route node and the intermediate node of the Huffman tree, the storage area of 4 bytes (two rows) is assigned to the branch and leaf area. The first half 2 bytes (the first half 1 row) of the 4 bytes corresponds to the branch tracing a left child node, and the latter half 2 bytes (the latter half 1 row) of the 4 bytes corresponds to the branch tracing a right child node. The first 4 bytes of the branch and leaf area is assigned to the route node.

The storage area of 2 bytes corresponding to the branch tracing the left child node and the branch tracing the right child node stores either the pointer or the leaf data corresponding to the generated Huffman tree. The pointer indicates that the child node is an intermediate node and includes the beginning address of the storage area assigned to the child node. The leaf data indicates that the child node is the leaf node and includes the bit map ID corresponding to the original symbol (decompression symbol) and the decompression symbol. The first bit of the pointer is set to "0," and the first bit of the leaf data is set to "1."

When decoding the Huffman code, the decompressing unit 132 extracts 1 bit from the compressed data, uses the extracted bit as an offset from the beginning position of the branch and leaf area, and selects the data corresponding to the branch tracing the left child node of the route node or the branch tracing the right child node. That is, the decompressing unit 132 traces the left child node when the bit extracted from the compressed data is "0" and traces the right child node when the bit extracted from the compressed data is "1." The decompressing unit 132 confirms the first bit of the selected data and obtains the decompression symbol and the bit map ID from the selected data (that is, the leaf data) when the first bit is "1."

On the other hand, when the first bit is "0," the decompressing unit 132 obtains the address from the selected data (that is, the pointer) and then extracts the next 1 bit from the compressed data. The decompressing unit 132 uses the extracted bit as the offset from the position indicated by the obtained address to trace the left child node or the right child node as the intermediate node. The decompressing unit 132 may decode the code by repeating tracing the pointer to reach any leaf data.

Figure 10:
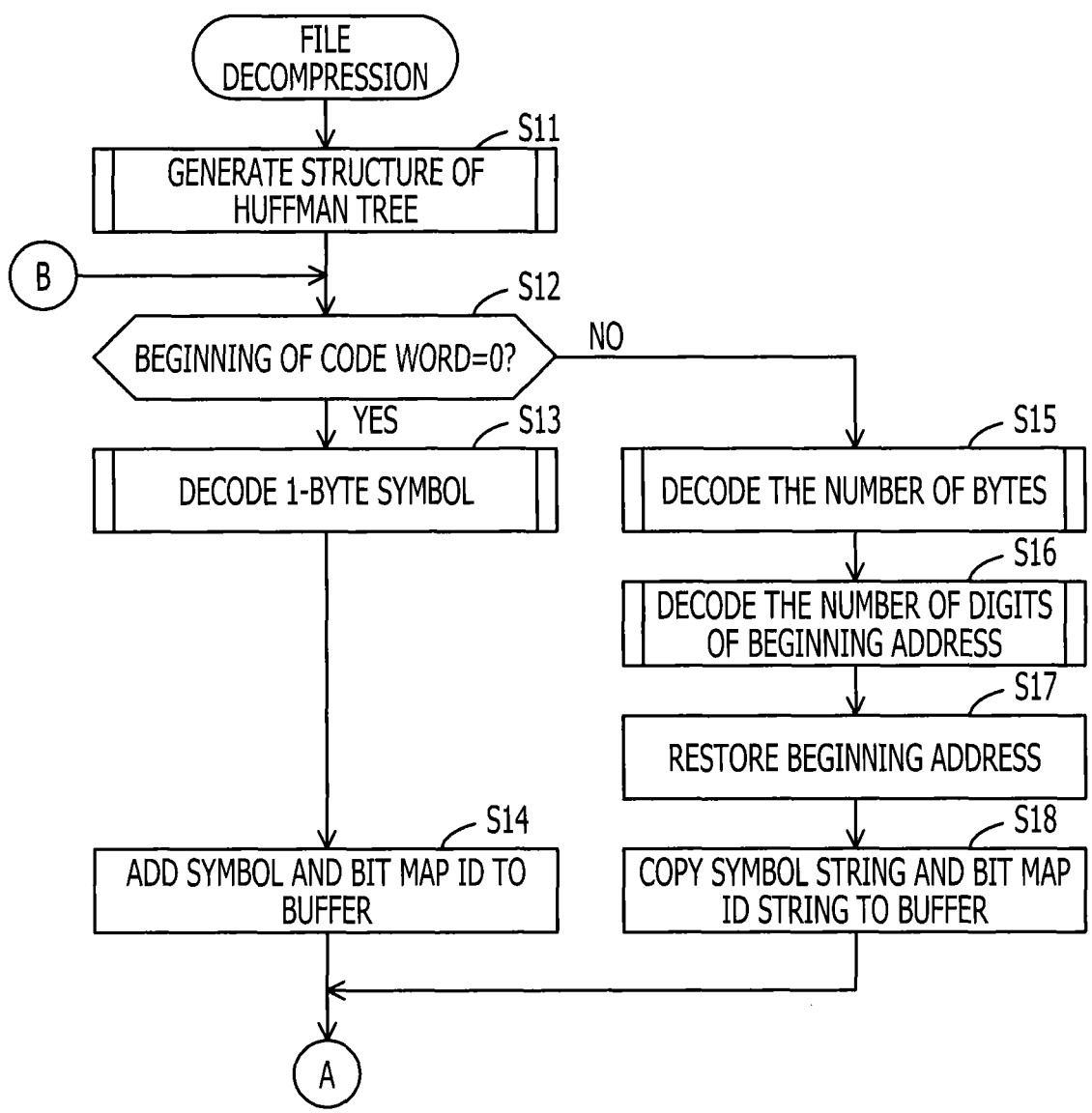
FIG. 10 is a flowchart illustrating a first procedure example of file decompression.

FIG. 10 is a flowchart illustrating a first procedure example of file decompression. (S11) Based on the code length of each of the symbols 0x00 to 0xFF described in the header unit of the compressed file 111, the Huffman tree generating unit 133 generates the structure data of the Huffman tree on the Huffman tree storage unit 134. The generating method of the structure data will be described in detail below.

(S12) The decompressing unit 132 confirms the first bit of the code word that is decompressed next and determines whether the first bit is equal to 0. If yes, the process goes to S13. If no, the process goes to S15.

(S13) The decompressing unit 132 refers to the structure data stored in the Huffman storage unit 134 and then decodes the 1 byte symbol that is subjected to the Huffman coding exciting behind the first bit of the code word. While decoding the 1-byte symbol, the decompressing unit 132 refers to the structure data to specify the bit map ID used to identify the bit map corresponding to the decoded 1 byte symbol. The Huffman coding by using the structure data will be described below.

(S14) The decompressing unit 132 adds the symbol decoded in S13 to the end of the buffer 121. The decompressing unit 132 adds the bit map ID specified in S13 to the end of the buffer 122. The process goes to S21.

(S15) The decompressing unit 132 refers to the structure data stored in the Huffman tree storage unit 134 to decode "the number of bytes" that is subjected to the Huffman coding existing behind the first bit of the code word. The Huffman decoding by using the structure data will be described below.

(S16) The decompressing unit 132 refers to the structure data stored in the Huffman tree storage unit 134 to decode "the number of digits" that is subjected to the Huffman coding existing behind the code that is decoded in S15. The Huffman coding by using the structure data will be described below.

(S17) The decompressing unit 132 calculates the upper bit string of "beginning address" in such a way that the "digit" decoded in S16 means the digit in which bit=1 first appears counted from the MSB. The decompressing unit 132 calculates the number of the rest of the bits of "the beginning address" and extracts the bit row for the number of the rest of the bits from the latter of the code that is decoded in S16. The decompressing unit 132 restores "the beginning address" by combining an upper bit string and a lower bit string.

(S18) The decompressing unit 132 obtains the symbol string of three or more bytes specified by "the number of bytes" decoded in S15 and the "the beginning address" restored in S17. The decompressing unit 132 duplicates the obtained symbol string in the end of the buffer 121. The decompressing unit 132 obtains the string of the bit map ID corresponding to the symbol string and then duplicates the string in the end of the buffer 122.

Figure 11:
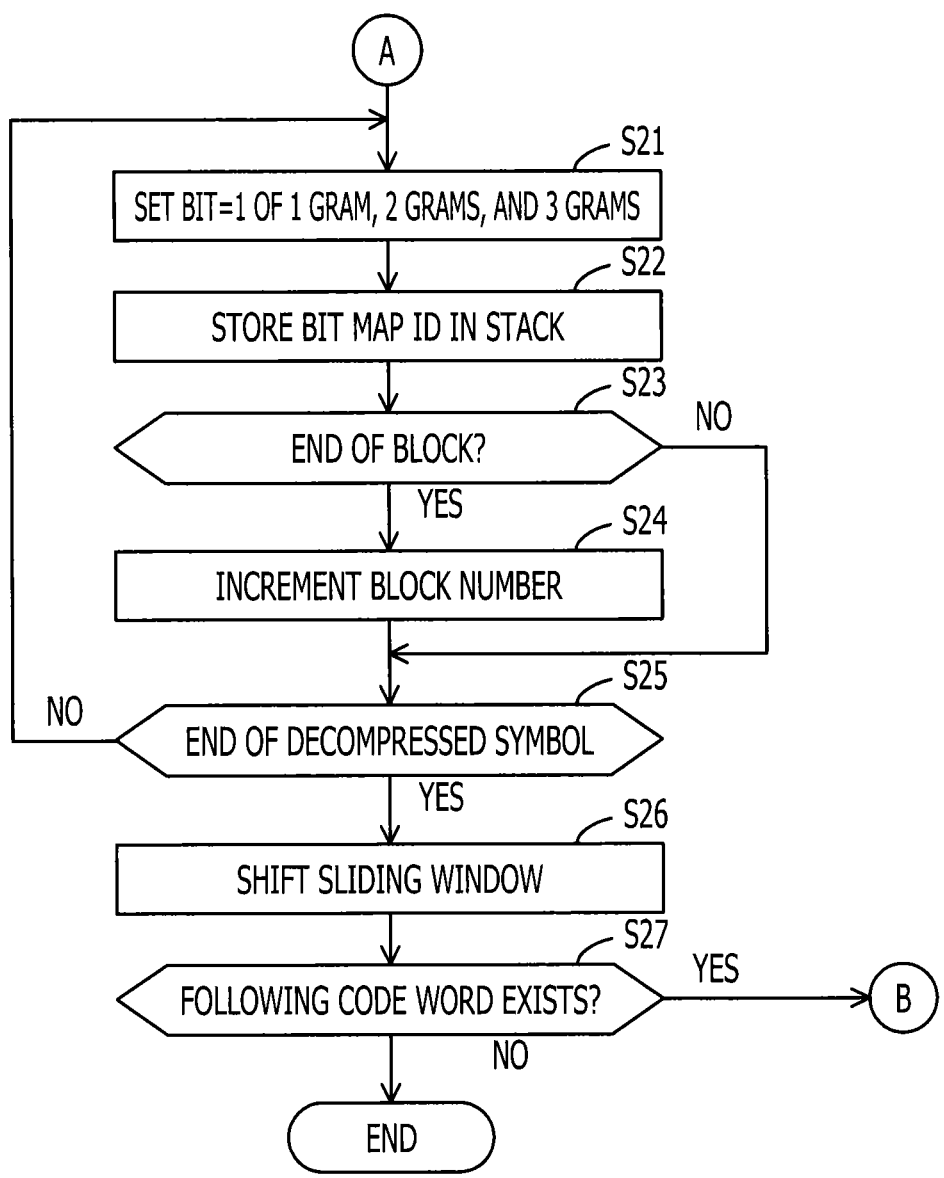
FIG. 11 is a flowchart (following chart) illustrating the first procedure example of the file decompression.

FIG. 11 is a flowchart illustrating the first procedure of the file decompression. (S21) The decompressing unit 132 selects one bit map ID in order staring from the bit map ID closer to the beginning thereof from among one or more bit map IDs obtained in S13 or S18. The decompressing unit 132 uses the selected bit map ID as the offset from the beginning of the area of 1 gram and then selects one bit map of 1 gram from the index 124.

The decompressing unit 132 uses the bit string, which is obtained by combining the bit map ID and the preceding bit map ID stored in the stack 123, as the offset from the beginning of the area of 2 grams to select one bit map of 2 gram from the index 124. The decompressing unit 132 uses the bit string obtained by combining this bit map ID, the preceding bit map ID stored in the stack 123, and the second preceding bit map ID as the offset from the beginning of the area of 3 grams and then selects the bit map of 3 grams from the index 124. The decompressing unit 132 sets the bit corresponding to the block that is currently being decompressed included in the selected bit map of 1 gram, 2 grams, and 3 grams to "1."

(S22) The decompressing unit 132 updates the preceding bit map ID and the second preceding bit map ID stored in the stack 123. That is, the decompressing unit 132 changes the preceding bit map ID into the second preceding bit map ID and then stores the bit map ID selected in S21 in the stack 123 as the preceding bit map ID.

(S32) The decompressing unit 132 determines whether the symbol corresponding to the bit map ID selected in S21 corresponds to the end of the block (for example, whether the address of the symbol in the buffer 121 indicates the border of 8k bytes). If yes, the process goes to S24. If no, the process goes to S25.

(S24) The decompressing unit 132 increments the block number indicating the position of the bit as an update target in each bit map included in the index 124. The current block number is stored in the storage area that is secured by the decompressing unit 132 on the RAM 102, for example.

(S25) The decompressing unit 132 determines whether one or more bit map IDs obtained in S13 or S18 are all selected (whether the bit map ID corresponding to the symbol in the end is selected). If all the bit map IDs are selected, the process goes to S26.

If not, the process goes to S21.

(S26) The decompressing unit 132 shifts the position of the sliding window to the number of symbols added to the buffer 121 in S14 or S18. (S27) The decompressing unit 132 determines whether the code word unit has a following cord word. If yes, the process goes to S12. If no, the process ends.

Figure 12:
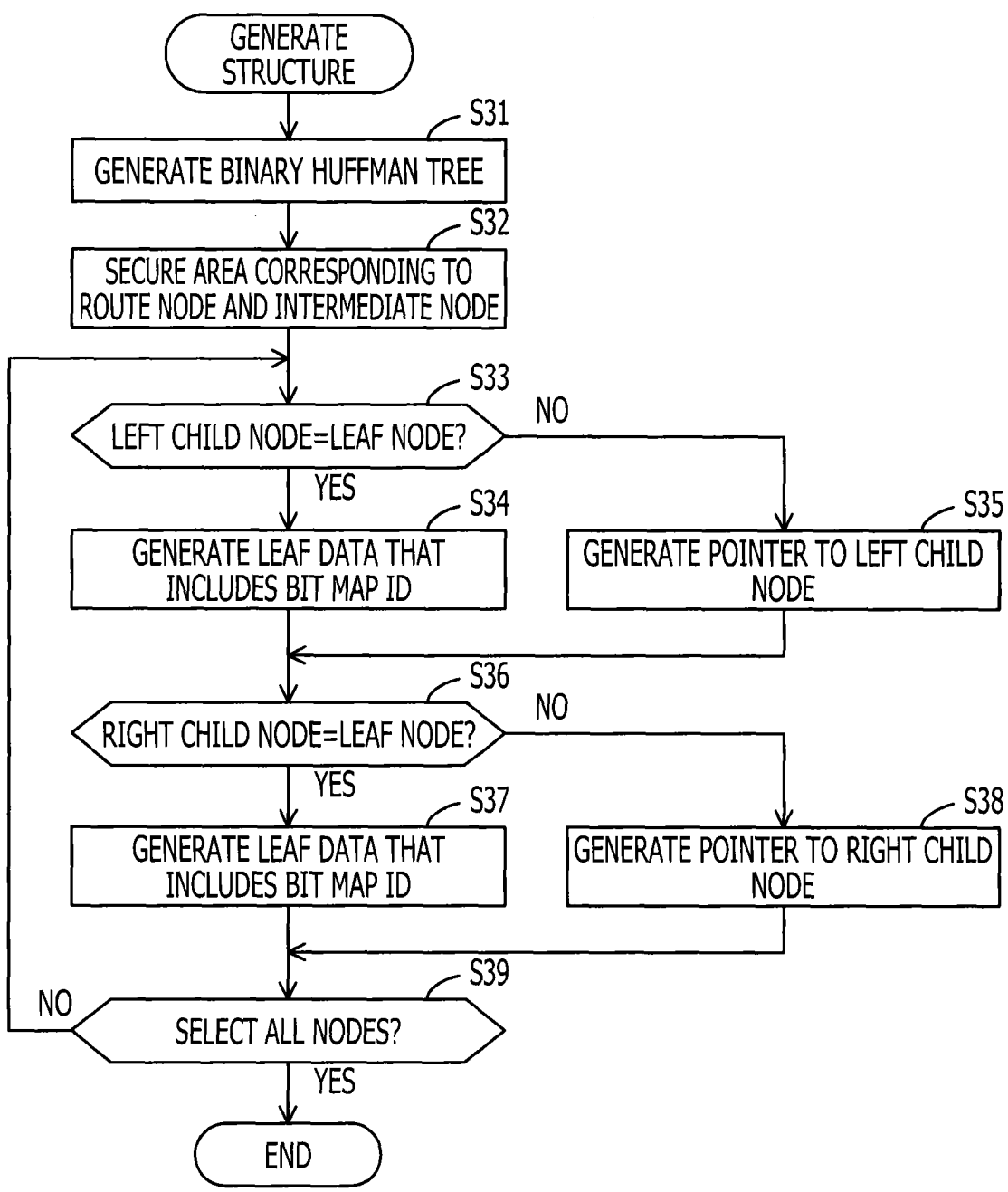
FIG. 12 is a flowchart illustrating the first procedure example of structure generation.

FIG. 12 is a flowchart illustrating the first procedure of structure generation. The structure generating processing illustrated in FIG. 12 is executed in the above described S11. (S31) The Huffman tree generating unit 133 generates the binary Huffman tree as described above based on the code length of each of the symbols 0x00 to 0xFF. That is, the Huffman tree generating unit 133 rearranges 256 patterns of the symbols in ascending order of the code length in the coding and rearranges 256 patterns of the symbols in ascending order of the numeral value where the code length of the symbols is similar. The Huffman tree generating unit 133 estimates the appearance frequency of each symbol based on the code length. The Huffman tree generating unit 133 generates a leaf node corresponding to the symbol and forms a branch toward the route node from the leaf node based on the appearance frequency. The Huffman tree generating unit 133 determines the Huffman code corresponding to each symbol by tracing the branch of the generated binary Huffman tree toward the leaf node from the route node.

(S32) The Huffman tree generating unit 133 counts the number of route nodes and intermediate nodes appearing in the binary Huffman tree that is generated in S31. The Huffman tree generating unit 133 secures the branch and leaf area of which the size is proportional to the counted number of nodes (for example, the number of nodes×2 rows×2 bytes) and assigns the storage area to each of the nodes. The beginning part of the branch and leaf area is assigned to the route node.

(S33) The Huffman tree generating unit 133 selects a single node from the route nodes and intermediate nodes appearing in the binary Huffman tree generated in S31. The Huffman tree generating unit 133 determines whether the left child node of the selected node is a leaf node. If yes, the process goes to S34. If no, the process goes to S35.

(S34) The Huffman tree generating unit 133 generates leaf data that includes the decompression symbol corresponding to the leaf node and the bit map ID of the bit map of 1 gram corresponding to the decompression symbol. The Huffman tree generating unit 133 stores the generated leaf data in the first half (the row corresponding to the left child node) of the storage area that is assigned to the node selected in S33.

(S35) The Huffman tree generating unit 133 generates a pointer that includes an address indicating the beginning of the storage area that is assigned to the intermediate node as the left child node. The Huffman tree generating unit 133 stores the generated pointer in the first half (the row corresponding to the left child node) of the storage area assigned to the node that is selected in S33.

(S36) The Huffman tree generating unit 133 determines whether the right child node selected in S33 is a leaf node. If yes, the process goes to S37. If no, the process goes to S38.

(S37) The Huffman tree generating unit 133 generates the leaf data that includes the decompression symbol corresponding to the leaf node and the bit map ID of the bit map of 1 gram corresponding to the decompression symbol. The Huffman tree generating unit 133 stores the generated leaf data in the latter half (the row corresponding to the right child node) of the storage area assigned to the node that is selected in S33.

(S38) The Huffman tree generating unit 133 generates the pointer that includes the beginning address indicating the beginning of the storage area assigned to the intermediate node as the right child node. The Huffman tree generating unit 133 stores the generated pointer in the latter half (the row corresponding to the right child node) of the storage area assigned to the node that is selected in S33.

(S39) The Huffman tree generating unit 133 determines whether all the route nodes and the intermediate nodes appearing in the binary Huffman tree are selected. If yes, the process ends. If no, the process goes to S33.

Figure 13:
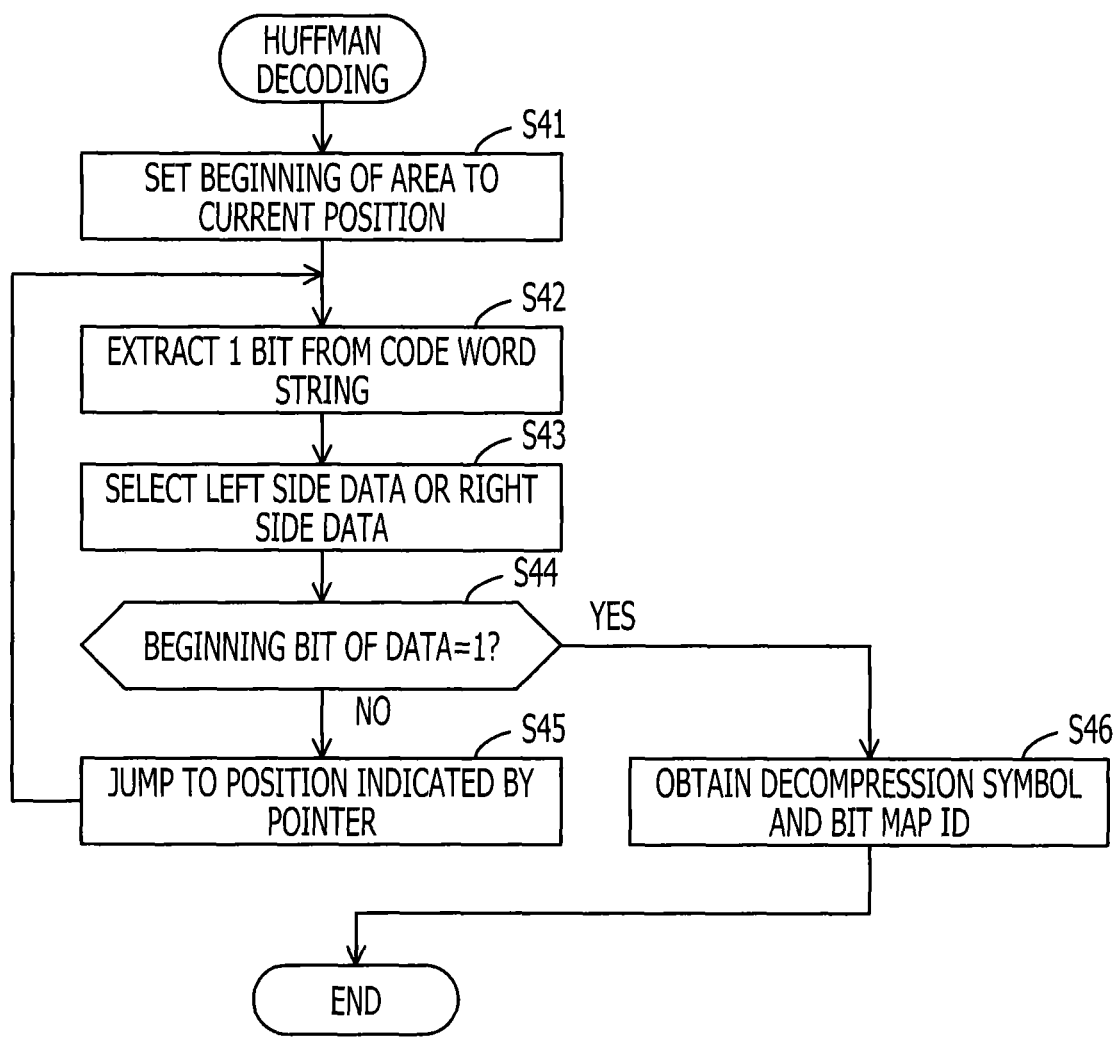
FIG. 13 is a flowchart illustrating the first procedure example of Huffman coding.

FIG. 13 is a flowchart illustrating the first procedure of the Huffman coding. The Huffman decoding processing illustrated in FIG. 13 is executed in S13, S15, and S16. (S41) With reference to the header area of the structure data stored in the Huffman tree storage unit 134, the decompressing unit 132 confirms the beginning address of the branch and leaf area. The decompressing unit 132 sets the position currently referenced in the structure data to the beginning of the branch and leaf area.

(S42) The decompressing unit 132 extracts the first 1 bit in a part in which the decompression is not completed (unextracted part) from the bit string of the code word unit included in the compressed file 111. (S43) The decompressing unit 132 uses the value of 1 bit extracted in S42 as a relative address (offset) from the position that is currently being referenced in the structure data to select the data (the leaf data or the pointer) for one row. If the extracted bit is "0," the decompressing unit 132 selects the data corresponding to the left child node. If the extracted bit is "1," the decompressing unit 132 selects the data corresponding to the right child node.

(S44) The decompressing unit 132 confirms the first bit of the data that is selected in S43. If the first bit=0, the selected data is determined to be a pointer.

The process goes to S45. If the first bit=1, the selected data is determined to be leaf data. The process goes to S46.

(S45) The decompressing unit 132 extracts the beginning address from the pointer as the data selected in S43 and jumps to the position indicated by the beginning address in the structure data (the position currently referenced is updated). The process goes to S42.

(S46) The decompressing unit 132 extracts the decompression symbol and the bit map ID from the leaf data as the data selected in S43. In S15 and S16, the bit map ID included in the leaf data is not used. In S15 and S16, the decompressing unit 132 does not generally extract the bit map ID from the leaf data.

Figure 14:
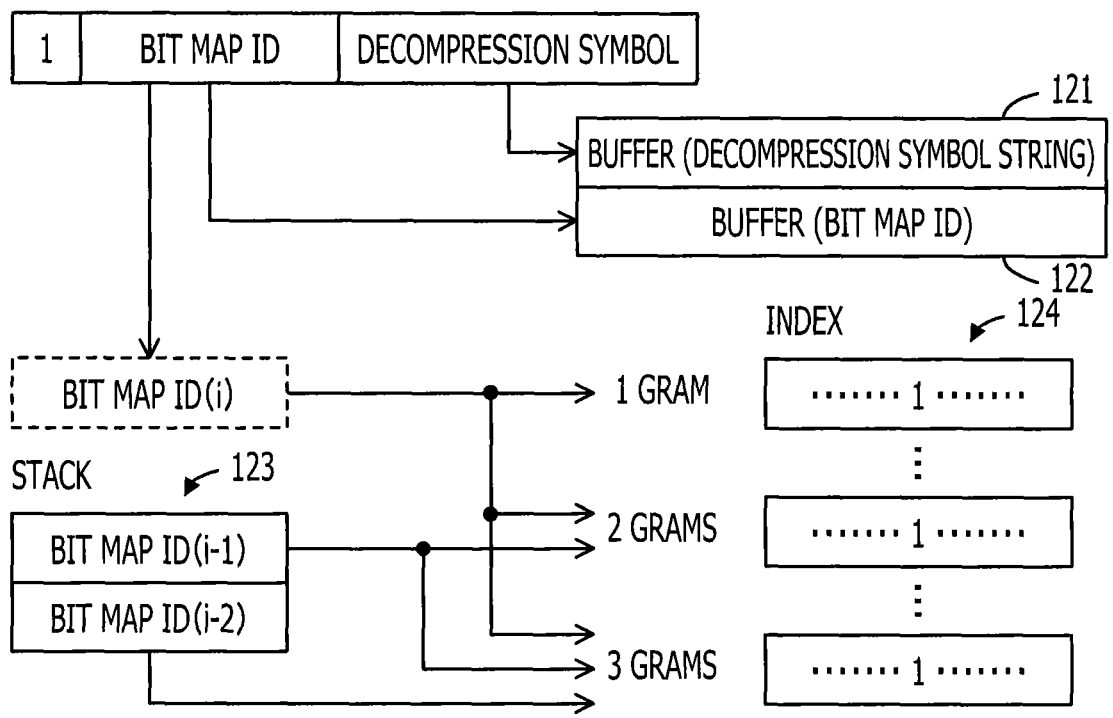
FIG. 14 illustrates a first index generation example.

FIG. 14 is a diagram illustrating a first index generation example. FIG. 14 illustrates an operation for decompressing the code word with the first bit=0. The decompressing unit 132 uses the bit string following the first bit of the code word, searches the leaf data from the structure data of the Huffman tree, and extracts the decompression symbol and the bit map ID from the leaf data. The decompressing unit 132 stores the extracted decompression symbol in the buffer 121 and stores the extracted bit map ID in the buffer 122.

The decompressing unit 132 selects the bit map of 1 gram from the index 124 where the bit map ID extracted from the leaf data as an identifier and then sets a single bit in the selected bit map to "1." The decompressing unit 132 selects the bit map of 2 grams from the index 124 where the value obtained by combining the bit map ID extracted from the leaf data with the preceding bit map ID stored in the stack 123 as an identifier and then sets a single bit in the selected bit map to "1." The decompressing unit 132 selects the bit map of 3 grams from the index 124 where the value obtained by combining the bit map ID extracted from the leaf data with the second preceding bit map ID stored in the stack 123 as an identifier and then sets a single bit in the selected bit map to "1."

The decompressing unit 132 changes the preceding bit map ID stored in the stack 123 into the second preceding bit map ID (for example, the preceding bit map ID is restored in the stack 123 as the second preceding bit map ID). The decompressing unit 132 stores, in the stack 123, the bit map ID extracted from the leaf data as the preceding bit map ID.

Figure 15:
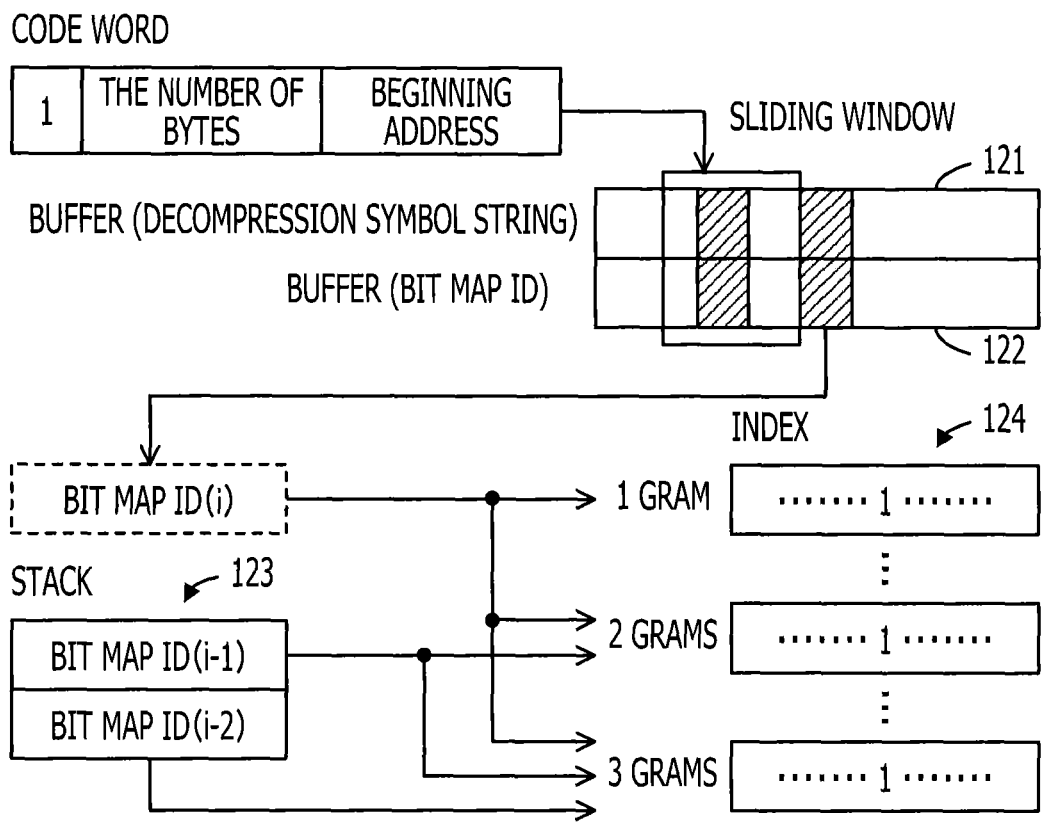
FIG. 15 illustrates a second index generation example.

FIG. 15 is a diagram illustrating a second index generation example. FIG. 15 illustrates operation of a case where the code word with the first bit=1 is decompressed. With reference to the structure data of the Huffman tree, the decompressing unit 132 restores "beginning address" and "the number of bytes" from the bit string following the first bit of the code word. The decompressing unit 132 duplicates the symbol string in the range, specified by "beginning address" and "the number of bytes" in the sliding window, in the end of the buffer 121 and then duplicates the string of the bit map ID corresponding to the duplicated symbol string in the end of the buffer 122.

The decompressing unit 132 selects the bit map of 1 gram from the index 124 as the identifier of the duplicated first bit map ID and then sets a single bit in the selected bit map to "1." The decompressing unit 132 selects the bit map of 2 gram from the index 124 where the value, which is obtained by combining the duplicated first bit map ID with the preceding bit map ID stored in the stack 123, as an identifier and then sets a single bit in the selected bit map to "1." The decompressing unit 132 selects the bit map of 3 grams from the index 124 where the value obtained by combining the duplicated first bit map ID, the preceding bit map ID and the second preceding bit map ID stored in the stack 123 as an identifier and then sets a single bit in the selected bit map to "1."

The decompressing unit 132 changes the preceding bit map ID stored in the stack 123 into the second preceding bit map ID. The decompressing unit 132 stores the duplicated first bit map ID as the preceding bit map ID in the stack 123. The decompressing unit 132 performs the above-described update of the stack 123 and the index 124 for the duplicated second and following bit map IDs, respectively.

According to the second embodiment, the structure data of the Huffman tree stores the bit map ID separately from the decompression symbol, and the bit map ID is used to select the bit map corresponding to the decompression symbol in the index 124. The numeral value as the decompression symbol may concurrently act as the bit map ID. For example, the index 124 includes 256 bit maps of 1 gram, and the 256 bit maps may be arranged in order of the numeral values 0x00 to 0xFF as the decompression symbol. In this case, the structure data of the Huffman tree does not generally store the bit map ID separately from the decompression symbol. In this case, the buffer unit 120 does not generally include the buffer 122.

Figure 16:
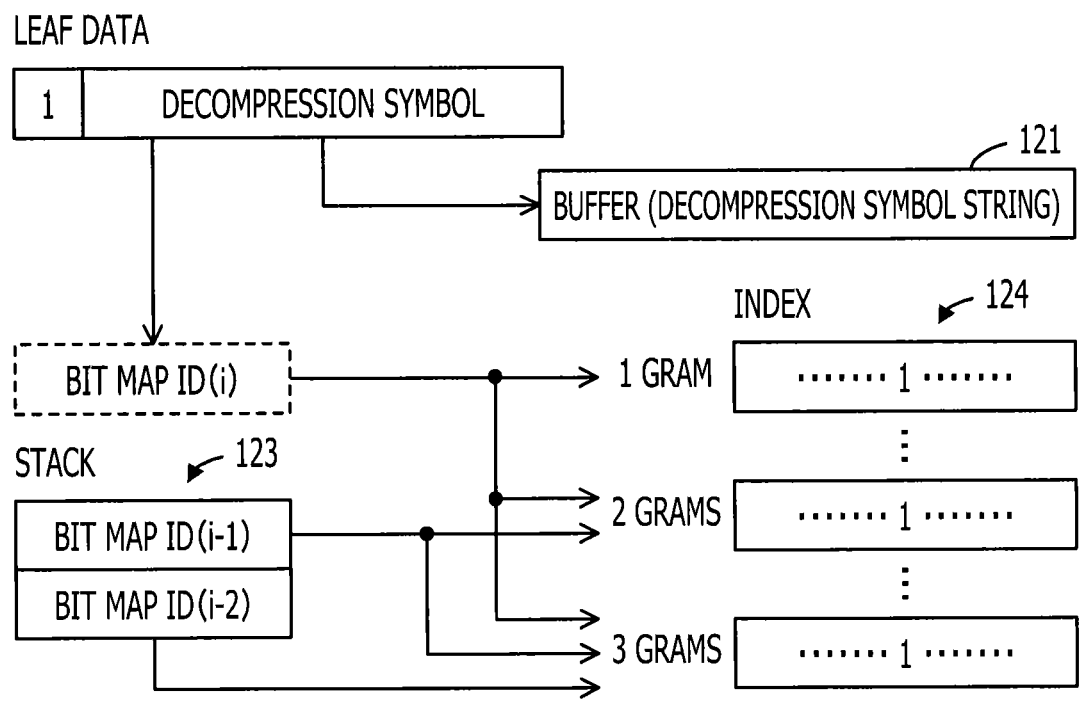
FIG. 16 illustrates a third index generation example.

FIG. 16 is a diagram illustrating a third index generation example. FIG. 16 illustrates operation of a case where the code word with the first bit=0 is decompressed. By using the bit string following the first bit of the code word, the decompressing unit 132 retrieves the leaf data from the structure data of the Huffman tree and extracts the decompression symbol from the leaf data. The decompressing unit 132 stores the extracted decompression symbol in the buffer 121.

The decompressing unit 132 selects the bit map of 1 gram from the index 124 where the decompression symbol concurrently acting as the bit map ID and then sets a single bit in the selected bit map to "1." The decompressing unit 132 selects the bit map of 2 gram from the index 124 where the value obtained by combining the decompression symbol and the preceding bit map ID stored in the stack 123 is an identifier and then sets a single bit in the selected bit map to "1." The decompressing unit 132 selects the bit map of 3 grams from the index 124 where the value obtained by combining the decompression symbol, the preceding bit map ID and the second preceding bit map ID stored in the stack 123 as in identifier and then sets a single bit in the selected bit map.

The decompressing unit 132 changes the preceding bit map ID stored in the stack 123 into the second preceding bit map ID. The decompressing unit 132 further stores the decompression symbol, which concurrently acts as the bit map ID, as the preceding bit map ID in the stack 123.

Figure 17:
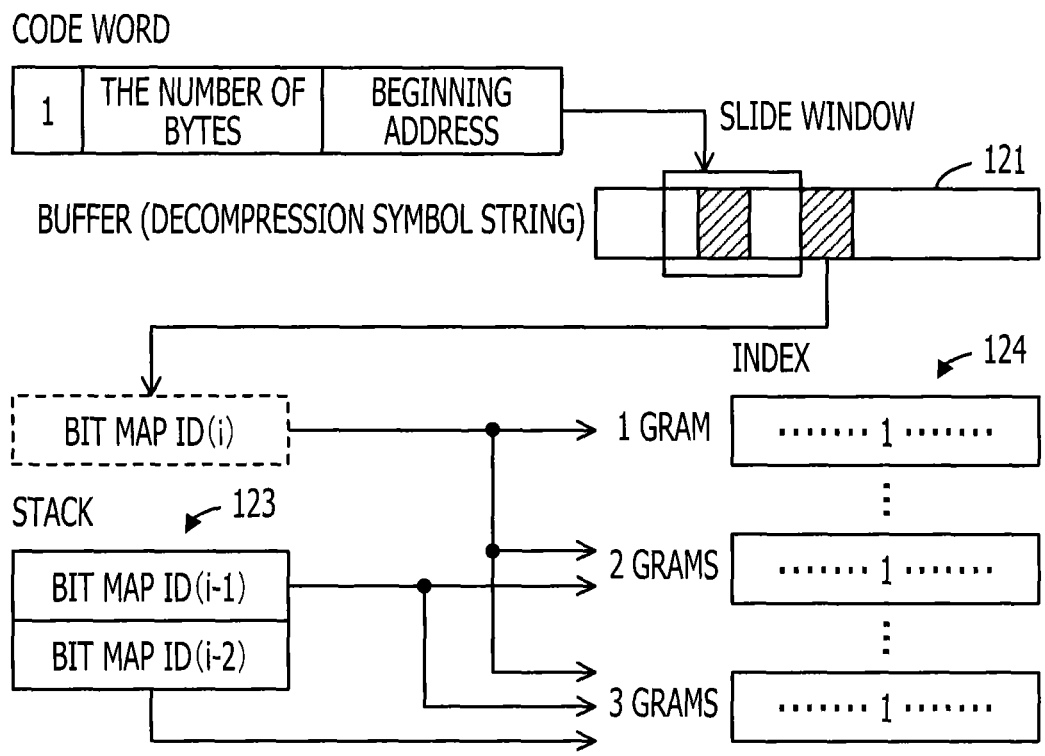
FIG. 17 illustrates a fourth index generation example.

FIG. 17 is a diagram illustrating a fourth index generation example. FIG. 17 illustrates an operation in a case where the code word with the first bit=1 is decompressed. The decompressing unit 132 restores "beginning address" and "the number of bytes" with reference to the structure data of the Huffman tree from the bit string following the first bit of the code word. The decompressing unit 132 duplicates, in the end of the buffer 121, the symbol string in the range that is specified by "beginning address" and "the number of bytes" in the sliding window.

The decompressing unit 132 selects the bit map of 1 gram from the index 124 where the first symbol in the string of the duplicated symbol concurrently acting as the bit map ID is an identifier and then sets a single bit in the selected bit map to "1." The decompressing unit 132 selects the bit map of 2 gram from the index 124 where the value obtained by combining the first symbol with the preceding bit map ID stored n the stack 123 as an identifier and then sets a single bit in the selected bit map to "1." The decompressing unit 132 selects the bit map of 3 grams from the index 124 where the value obtained by combining the first symbol, the preceding bit map ID, and the second preceding bit map ID stored in the stack 123 and then sets a single bit in the selected bit map to "1."

The decompressing unit 132 changes the preceding bit map ID stored in the stack 123 into the second preceding bit map ID. The decompressing unit 132 stores the first symbol, which concurrently acts as the bit map ID, as the preceding bit map ID in the stack 123. The decompressing unit 132 performs the above-described update of the stack 123 and the index 124 for the symbols following the second symbol that concurrently act as the bit map ID, respectively.

According to the second embodiment, "1 gram" in the index 124 is a character code independent 1-byte symbol (0x00 to 0xFF). However, "1 gram" may be a single character code dependent character. For example, according to the character code system in which a single character is represented by 2 bytes, "2 grams" corresponds to a character string represented by 4 bytes, and "3 grams" corresponds to a character string represented by 6 bytes. In the index 124, letters with different numbers of bytes per character (for example, a 1-byte letter and a 2-byte letter) may exist together with "1 gram."

According to the information terminal device 100 of the second embodiment, since the bit map ID corresponding to the decompression symbol is registered in the structure data of the Huffman tree, the index 124 corresponding to the decompressed data may be effectively generated while the compressed file 111 is decompressed. That is, when the area in which the desired bit map is stored in the index 124 is directly accessed by using the bit map ID registered in the structure data, the access to the RAM 102 may be reduced. By providing the stack 123 that stores the preceding bit map ID and the second preceding bit map ID, the access to the bit map of 2 grams and 3 grams may be performed more efficiently than the retrieval of the preceding bit map ID and the second preceding bit map ID from the buffer 122. At a time when the decompression of the compressed file 111 is completed, the retrieval of the decompressed data may be started because the index 124 corresponding to the decompressed data is generated.

[Third Embodiment]

A third embodiment will be described below. The difference between the second embodiment and the third embodiment will be mainly described, so that the description of the similar matters between thereof are omitted. According to the third embodiment, the method for decoding the Huffman code by using the structure of the structure data of the Huffman tree and the structure data is different from the second embodiment. As with the information terminal device 100 according to the second embodiment, the information terminal device according to the third embodiment may be achieved by the hardware configuration illustrated in FIG. 2 and may be achieved by the software configuration illustrated in FIG. 8. By using the codes in FIGS. 2 and 8 used in the second embodiment, the third embodiment will be described below.

FIG. 18 is a diagram illustrating an example of a deformed Huffman tree. When decompressing the compressed file 111 with reference to the structure data forming the Huffman tree, the information terminal device according to the third embodiment deforms the Huffman tree to improve the efficiency of decompressing processing.

The information terminal device specifies a maximum code length of 256 codes determined by the Huffman tree and then divides the maximum code length into an upper n bit and a lower m bit (n and m are an integer that is 1 or more). In this case, "n" as a threshold value may be a fixed prescribed value and may be determined based on the information of the code length so that the total of the appearance frequency of the symbol of which the code length is less than n bit is a desired frequency. The information terminal device deforms the binary Huffman tree with one bit associated with one branch into a Huffman tree with a plurality of bits may be associated with one branch and the leaf node of which the depth is 1 or 2. As for the deformed Huffman tree, a single symbol may be associated with a plurality of leaf nodes.

That is, the information terminal device sets the length of the code that is equal to or lower than n bit to n bit by adding a redundant bit to the end of the code that is less than n bit. For example, if n=4, the code 0 is converted into eight bit strings 0000 to 0111 and the code 10 is converted into four bit strings 1000 to 1011. The information terminal device separates the bit string of the upper n bit from the code exceeding n bit and then sets the length of the rest of the bit strings to m bit. For example, if n=4 and m=2, the code 11110 is converted into the bit string 1111 and the lower bit string 00, 01, and the code 111110 is converted into the bit string 1111 and the lower bit string 10.

As for the deformed Huffman tree, by using the bit string of the upper n bit, the leaf node corresponding to the symbol of which the code length is equal to or less than n bit may be traced from the route node. The intermediate node may be traced by using the bit string of the upper n bit, and the leaf node corresponding to the symbol of which the code length exceeds n bit may be traced from the intermediate node. That is, as for the deformed Huffman tree, the symbol with a high appearance frequency may be retrieved from the code by tracing the branch one time, and the symbol with a low appearance frequency may be retrieved from the code by tracing the branch two times.

To decompress the compressed file 111 by using the deformed Huffman tree, the information terminal device extracts the bit string of n+m bits from the compressed file 111 and obtains the decompression symbol from the upper n bit or the combination of the upper n bit with the lower m bit. At this time, the whole extracted n+m bits is not included in the code corresponding to the decompression symbol. The Huffman tree illustrated in FIG. 18 obtains the symbol 0x00 as a decompression symbol, for example, when the bit string 000110 is extracted from the compressed file 111. Since the symbol 0x00 is coded to the code 0 of 1 bit, the bit string 00110 of 5 bits as the rest of the extraction may be included in the next code or code word, the symbol is not handled as the coded symbol.

Figure 19:
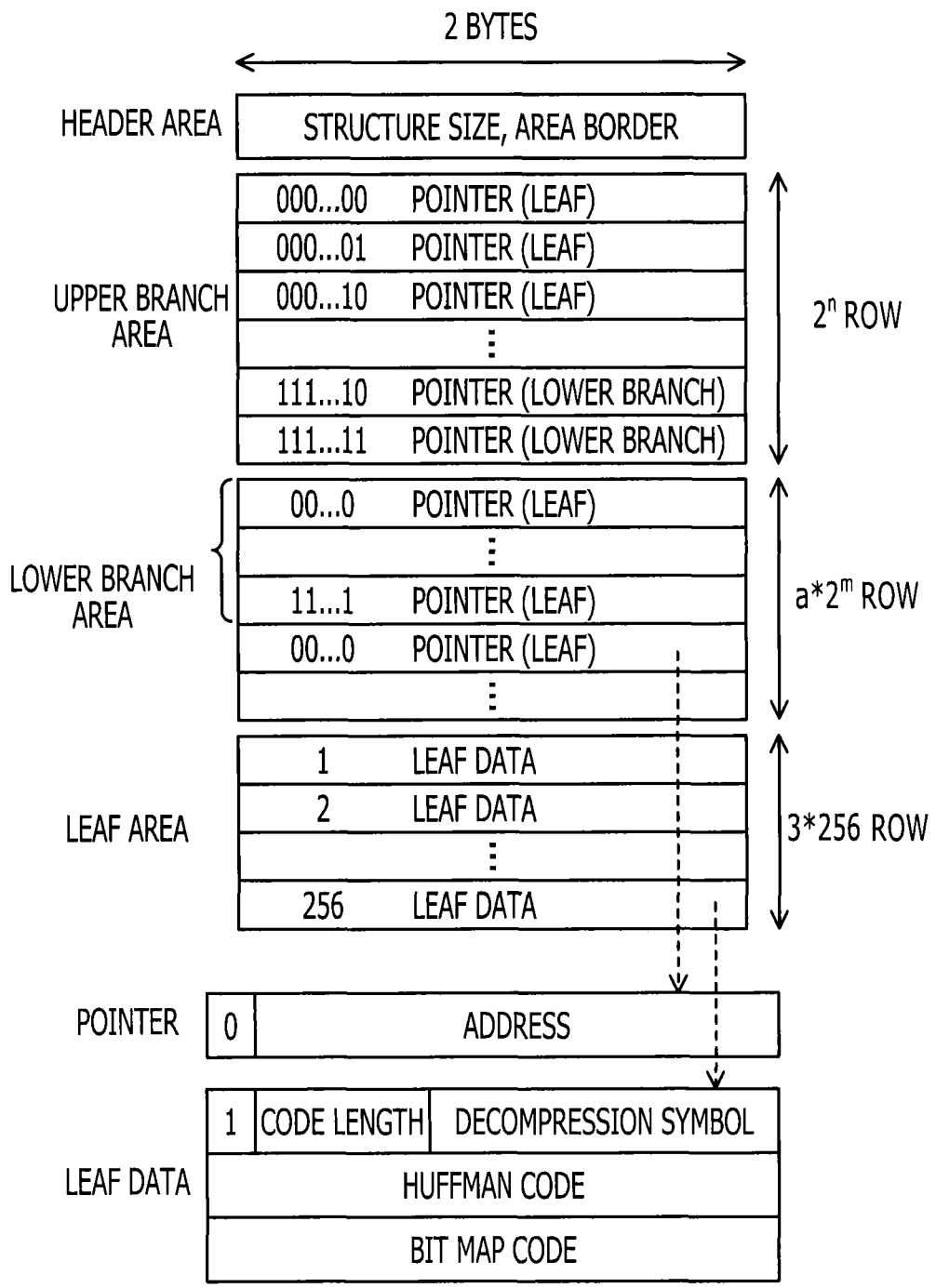
FIG. 19 illustrates a second example of the structure data forming the Huffman tree.

FIG. 19 is a diagram illustrating a second example of structure data forming a Huffman tree. The structure data illustrated in FIG. 19 is generated by the Huffman tree generating unit 133 and is then stored in the Huffman tree storage unit 134. Here, "1 row" illustrated in FIG. 19 corresponds to the storage area of 2 bytes. The structure of the Huffman tree includes a header area, an upper branch area, a lower branch area, and a leaf area.

The header area stores information for management such as a size of the structure data, an address indicating the border between the areas, and the like. The upper branch area stores 2 to the power of n pointers that are represented by 2 bytes, respectively. Each pointer of the upper branch area includes the beginning address of any of the pointer set in the lower branch area or the beginning address of any of the leaf data in the leaf area. The first bit of the pointer of the upper branch area is set to "0" to be indicated as a pointer. The pointer from the upper branch area to the leaf area corresponds to the branch from the route node to the leaf node illustrated in FIG. 18, and a plurality of pointers of the upper branch area may point a single block of the leaf data. The pointer from the upper branch area to the lower branch area corresponds to the branch from the route node to the intermediate node illustrated in FIG. 18.

The lower branch area stores a set (a is an integer that is 1 or more) of 2 to the power of m pointers represented by 2 bytes, respectively. Each of the pointers of the lower branch area includes the beginning address of any of the leaf data in the leaf area. The first bit of the pointer of the lower branch area is set to "0" to be indicated as a pointer. The pointer from the lower branch area to the leaf area corresponds to the branch from the intermediate node to the leaf node illustrated in FIG. 18, and a plurality of pointers of the lower branch area may point a single block of the leaf data. The number of sets a corresponds to the number of intermediate nodes in the deformed Huffman tree.

The leaf area stores the leaf data corresponding to 256 symbols 0x00 to 0xFF. In the leaf area, the leaf data is arranged in substantially the same order as the leaf node illustrated in FIGS. 7 and 18. That is, the leaf data corresponding to the symbol with a smaller code length is stored in the position where the address is smaller, and the leaf data corresponding to the symbol of which the numeral value is smaller among the symbols with the similar code lengths is stored in the position where the address is smaller. The leaf data of each symbol includes the decompression symbol, the Huffman symbol obtained by coding the symbol the information of the code length, and the bit map ID. The first bit of the leaf data is set to "1" to be indicated as the leaf data. The leaf data is represented in 6 bytes, for example. The size of the leaf data is determined to be a prescribed value when the structure data is generated and is adjustable depending on the type of information to be included in the leaf data. For example, the leaf data does not generally include the Huffman code.

In this case, the leaf data is represented by 4 bytes.

If the bit string of n+m bits is extracted as described above, the bit string of the upper n bit is used as a relative address (offset) where the beginning of the upper branch area is standard, and the pointer of the upper branch area stored in the position corresponding to the offset is selected. When the selected pointer does not point the leaf data, the bit string of the lower m bit is used as an offset from the position pointed by the pointer in the upper branch area. Thus, the pointer of the lower branch area stored in the position according to the offset is selected. In this manner, by tracing the pointer one or two times from the upper branch area, the leaf data in the leaf area may be referenced.

Figure 20:
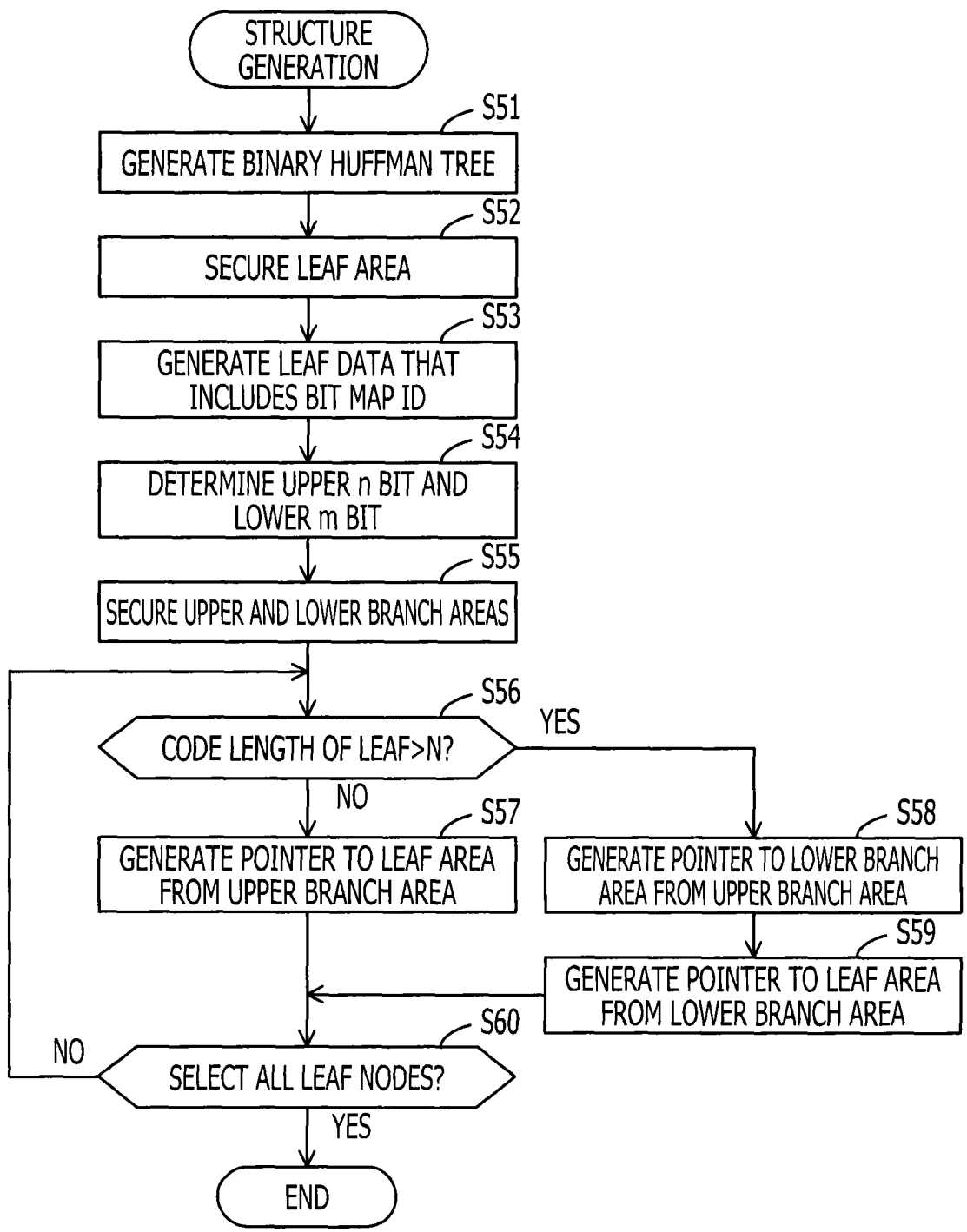
FIG. 20 is a flowchart illustrating the second procedure example of the structure generation.

FIG. 20 is a flowchart illustrating a second procedure of the structure generation. The structure generating processing illustrated in FIG. 20 is executed in S11 described in the second embodiment. (S51) The Huffman tree generating unit 133 generates the binary Huffman tree as described above based on the code length of each of the symbols 0x00 to 0xFF. By tracing the branch of the generated binary Huffman tree, the Huffman tree generating unit 133 determines the Huffman code corresponding to each symbol.

(S52) The Huffman tree generating unit 133 secures the leaf area of which the size is 6 bytes (or prescribed bytes) ×256 in the Huffman tree storage unit 134. (S53) The Huffman tree generating unit 133 writes the leaf data, which corresponds to each symbol in an order of the symbols arranged in S51, into the leaf area secured in S52. The leaf data of each symbol includes the bit map ID and the information indicating the decompression symbol, the Huffman code, and the code length.

(S54) The Huffman tree generating unit 133 divides the maximum code length of the code corresponding to the symbols 0x00 to 0xFF into the upper n bit and the lower m bit as described above. (S55) The Huffman tree generating unit 133 secures the upper branch area of 2 bytes×$2^n$ in the Huffman tree storage unit 134. The Huffman tree generating unit 133 calculates the number a (the number of intermediate nodes in the deformed Huffman tree) as a prefix of the code, of which the number of bits exceeds n, in the bit string of n bit of $2^n$ patterns. The Huffman tree generating unit 133 secures the lower branch area of 2 bytes×a×$2^m$ in the Huffman tree storage unit 134.

(S56) The Huffman tree generating unit 133 selects the leaf data for a single symbol in the leaf area in ascending order of the address. The Huffman tree generating unit 133 determines whether the code length indicated by the selected leaf data is larger than a threshold value n. If yes, the process goes to S58. If no, the process goes to S57.

(S57) The Huffman tree generating unit 133 calculates the number of pointers of the upper branch area=2 to the power of n−L where the code length is L. The Huffman tree generating unit 133 writes the pointer that includes the beginning address of the selected leaf data for the calculated number of pointers in ascending order of the address in the area in which the pointer is not written in the upper branch area. For example, if n=11, 1024 pointers pointing the leaf data corresponding to a 1-bit code are written in the upper branch area, 512 pointers pointing the leaf data corresponding to the code of 1 bit, two pointers pointing the leaf data corresponding to the code of 10 bits, and one pointer pointing the leaf data corresponding to the code of 11 bits are written into the upper branch area.

(S58) The Huffman tree generating unit 133 confirms the beginning address of the area in which the pointer in the upper branch area is not written. The Huffman tree generating unit 133 writes the pointer that includes the address of the confirmed lower branch area into the position specified by the upper n bit of the Huffman code indicated by the selected leaf data in the upper branch area. If the pointer is already written into the position specified by the upper n bit, the pointer is not generally written.

(S59) The Huffman tree generating unit 133 calculates the number of pointers in the lower branch area=2 to the power of n+m−L. The Huffman tree generating unit 133 writes the pointer that includes the beginning address of the selected leaf address for the calculated number of pointers in ascending order of the address in the area in which the pointer is not written in the lower branch area. For example, if n=11 and m=3, four pointers pointing the leaf data corresponding to the code of 12 bits are written, and one pointer pointing the leaf data corresponding to the code of 14 bits is written in the lower branch area.

(S60) The Huffman tree generating unit 133 determines whether the leaf data corresponding to all the symbols in S56 is selected. If yes, the process ends. If no, the process goes to S56.

Figure 21:
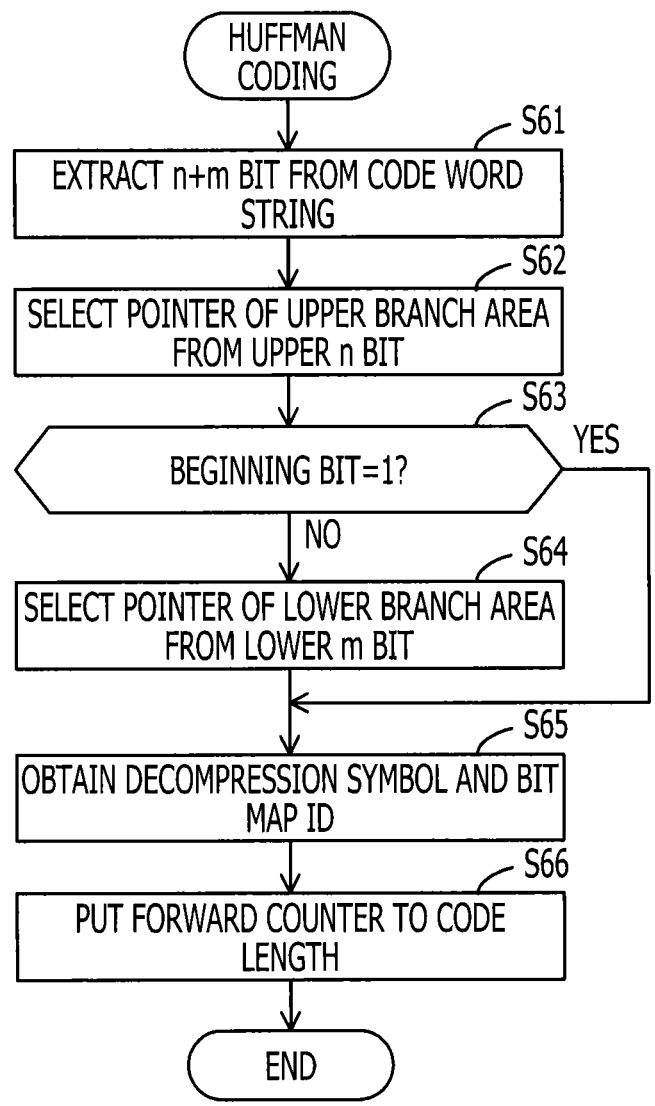
FIG. 21 is a flowchart illustrating the second procedure example of the Huffman coding.

FIG. 21 is a flowchart indicating the second procedure of the Huffman decoding. The Huffman decoding processing illustrated in FIG. 21 is performed in the above-described S13, S15, and S16. (S61) The decompressing unit 132 extracts the bit string of n+m bits, of which the decompression is not completed, from the code word string of the code word unit included in the compressed file 111.

(S62) The decompressing unit 132 refers to the header area of the structure data stored in the Huffman tree storage unit 134 to confirm the beginning address of the upper branch area. The decompressing unit 132 uses the upper n bit of the bit string extracted in S61 as a relative address (offset) from the beginning of the upper branch area to select a single pointer in the upper branch area. The decompressing unit 132 obtains the data stored in the position indicated by the selected pointer (the position specified by the address included in the pointer).

(S63) The decompressing unit 132 confirms the first bit of the data obtained in S62. If the first bit=1, the decompressing unit 132 determines that the obtained data is the leaf data. The process goes to S65. If the first bit=0, the decompressing unit 132 determines that the obtained data is the pointer of the lower branch area. The process goes to S64.

(S64) The decompressing unit 132 uses the lower m bit of the bit string extracted in S61 as an offset from the position pointed by the pointer of the upper branch area to select a single pointer in the lower branch area. The decompressing unit 132 obtains the leaf data of the position (the position specified by the address included in the pointer) pointed by the selected pointer.

(S65) The decompressing unit 132 extracts the decompression symbol and the bit map ID from the leaf data obtained in S62 or S64. The decompressing unit 132 extracts the bit map ID from the leaf data. In the above-described S15 and S16, the bit map ID included in the leaf data is not used. The decompressing unit 132 does not generally extract the bit map ID from the leaf data in S15 and S16.

(S66) The decompressing unit 132 extracts the information of the code length from the leaf data obtained in S62 or S64 and then puts forward the counter, which indicates which position in the code word string the decompression is completed, to the code length. The counter is stored in the RAM 102.

Figure 22:
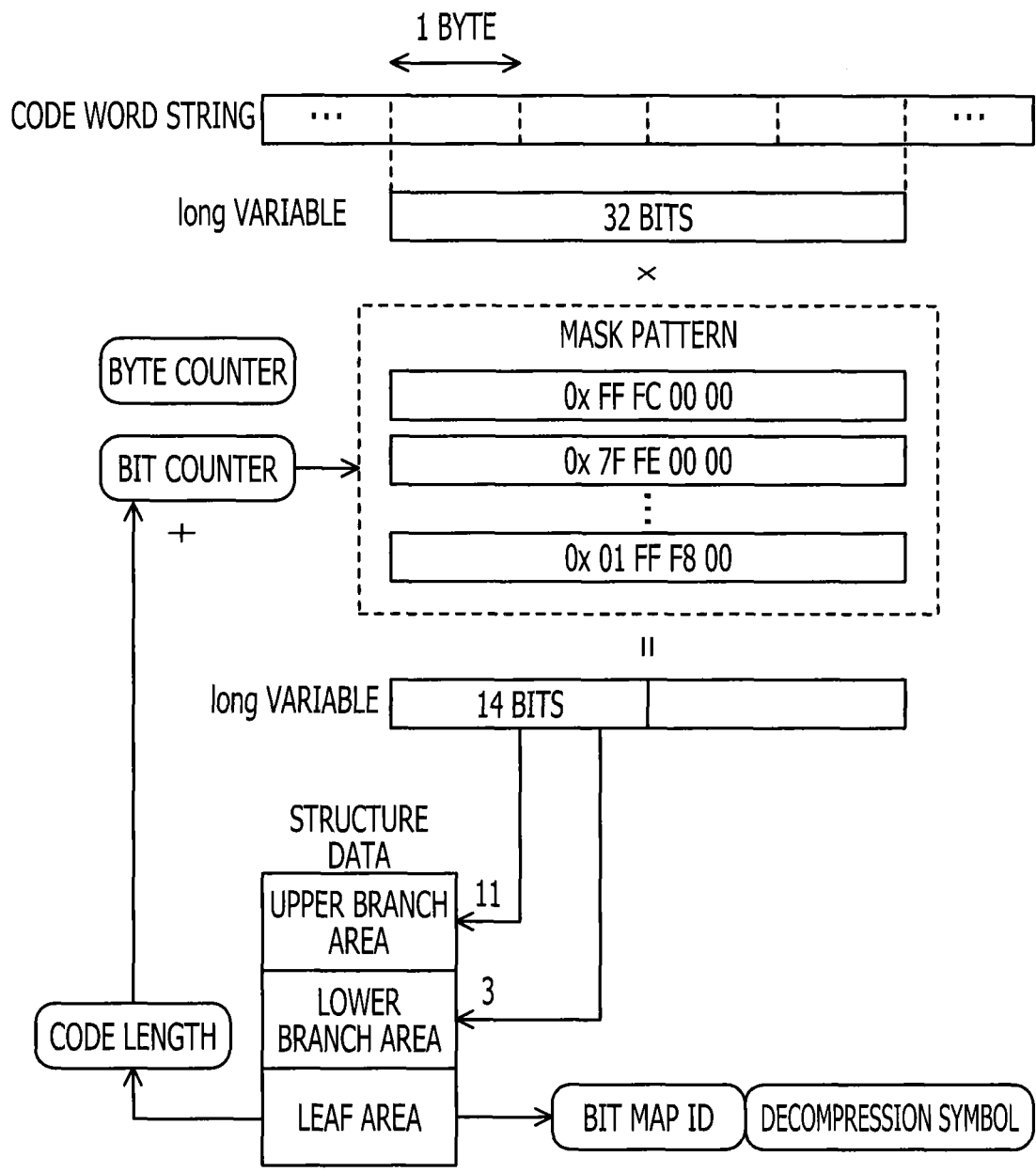
FIG. 22 illustrates an example of bit calculation in the Huffman coding.

FIG. 22 is a diagram illustrating an example of bit calculation in the Huffman decoding. Here, the maximum code length of the code used in the compressed file 111 is 14, and n is equal to 11. The information terminal device holds the byte counter and the bit counter on the RAM 102 to manage the beginning position of part where the decompression is not completed in the code word string stored in the buffer. The byte counter indicates the number of bytes from the beginning of the buffer to which the beginning of the part where the decompression is not completed belongs. The bit counter indicates the number of bytes from the break of bytes (a break for every 8 bits) in which the beginning of the part where the decompression is not completed exists. The bit counter obtains the value within the range starting from 0 until 7, and the byte counter is incremented when the bit counter is circulated.

The decompressing unit 132 cuts out the bit string by 4-byte unit (32 bits) from the code word string stored in the buffer. That is, the decompressing unit 132 assigns the bit string of 32 bits, of which the position indicated by the byte counter is the beginning, to a long variable. At this time, the first bit of the long variable is a break of the bytes and is not generally the beginning of the part in which the decompression is not completed.

By applying one of eight mask patterns to the bit string of long variable, the decompressing unit 132 extracts the bit string of 14 bits that does not complete the decompression thereof. The mask pattern, which is a bit string in which consecutive 14 bits out of 32 bits are set to "1" and the other bits are set to "0," is stored on the RAM 102. There are various mask patterns. For example, $1^{st}$ to $14^{th}$ bit counted from the MSB are "1," $2^{nd}$ to $15^{th}$ bit counted from the MSB are "1," $4^{th}$ to $17^{th}$ bit counted from the MSB are "1," $5^{th}$ to $18^{th}$ bit counted from the MSB are "1," $6^{th}$ to $19^{th}$ bit counted from the MSB are "1," $7^{th}$ to $20^{th}$ bit counted from the MSB are "1," and $8^{th}$ to $21^{st}$ bit counted from the MSB are "1." The decompressing unit 132 selects one of the mask patterns according to the bit counter and performs the AND for each bit between the bit string of the long variable and the selected mask pattern. The decompressing unit 132 obtains the bit string of 14 bits by shifting the result of the AND.

The decompressing unit 132 uses the upper 11 bits in the bit string of 14 bits as an offset used to select a single pointer from the upper branch area of the structure data. The decompressing unit 132 uses the lower 3 bits in the bit string of 14 bits as the offset to select a single pointer from the lower branch area of the structure data. Therefore, the decompressing unit 132 obtains, from the leaf area, the decompression symbol and the information indicating the bit map ID and the code length. The bit map ID is used to update the index 124. The decompressing unit 132 increases the value of the bit counter to the code length. Every time the bit counter is circulated (the bit counter returns from 7 to 0), the byte counter is incremented.

The information terminal device according to the third embodiment may achieve the advantages equivalent to the second embodiment. According to the third embodiment, as for the code of which the number of bits is equal to or less than n, the decompression symbol and the bit map ID may be retrieved by tracing the pointer of the structure data one time. As for the code of which the number of bits is more than n, and the decompression symbol and the bit map ID may be retrieved by tracing the pointer two times. Compared to the method for tracing the pointer according to the binary Huffman tree, the number of access to the RAM 102 may be reduced for each bit of the code word. Thus, the decompression of the compressed file 111 may become effective.

By tracing, by the pointer of two stages, the symbol corresponding to the code of which the number of bits is more than n, the number of redundant pointers pointing the similar decompression symbol may be reduced compared to the method for tracing, by the pointer of one stage, all the symbols, so that the data amount of the structure data may be suppressed. For example, if the maximum code length is 14, $2^{14}$=16k (65536) pointers are generated when all the symbols may be traced by the pointer of one stage. On the contrary, according to the method of the third embodiment, if n=11, $2^{11}$=2k (2048) pointers are generated, and a plurality of sets of eight pointers is generated in the lower branch area.

According to the third embodiment, the numeral value as the decompression symbol may concurrently act as the bit map ID as described in the second embodiment. In this case, the structure data of the Huffman tree does not generally store the bit map ID separately from the decompression symbol. In this case, the buffer unit 120 does not generally include the buffer 122.

[Fourth Embodiment]

A fourth embodiment will be described below. The difference between the fourth embodiment and the second embodiment will be mainly described, so that the description of the similar matters betweenthereof are omitted. According to the fourth embodiment, an index is generated where a word straddling two blocks is handled as a word belonging to both blocks. Due to this, when a keyword specified by a user straddles two blocks, both the two blocks may be prevented from being included in the retrieval result. As with the information terminal device 100 according to the second embodiment, the information terminal device according to the fourth embodiment may be achieved by the hardware configuration illustrated in FIG. 2 and by the software configuration illustrated in FIG. 8. By using the numerals illustrated in FIGS. 2 and 8, the fourth embodiment will be described below.

Figure 23:
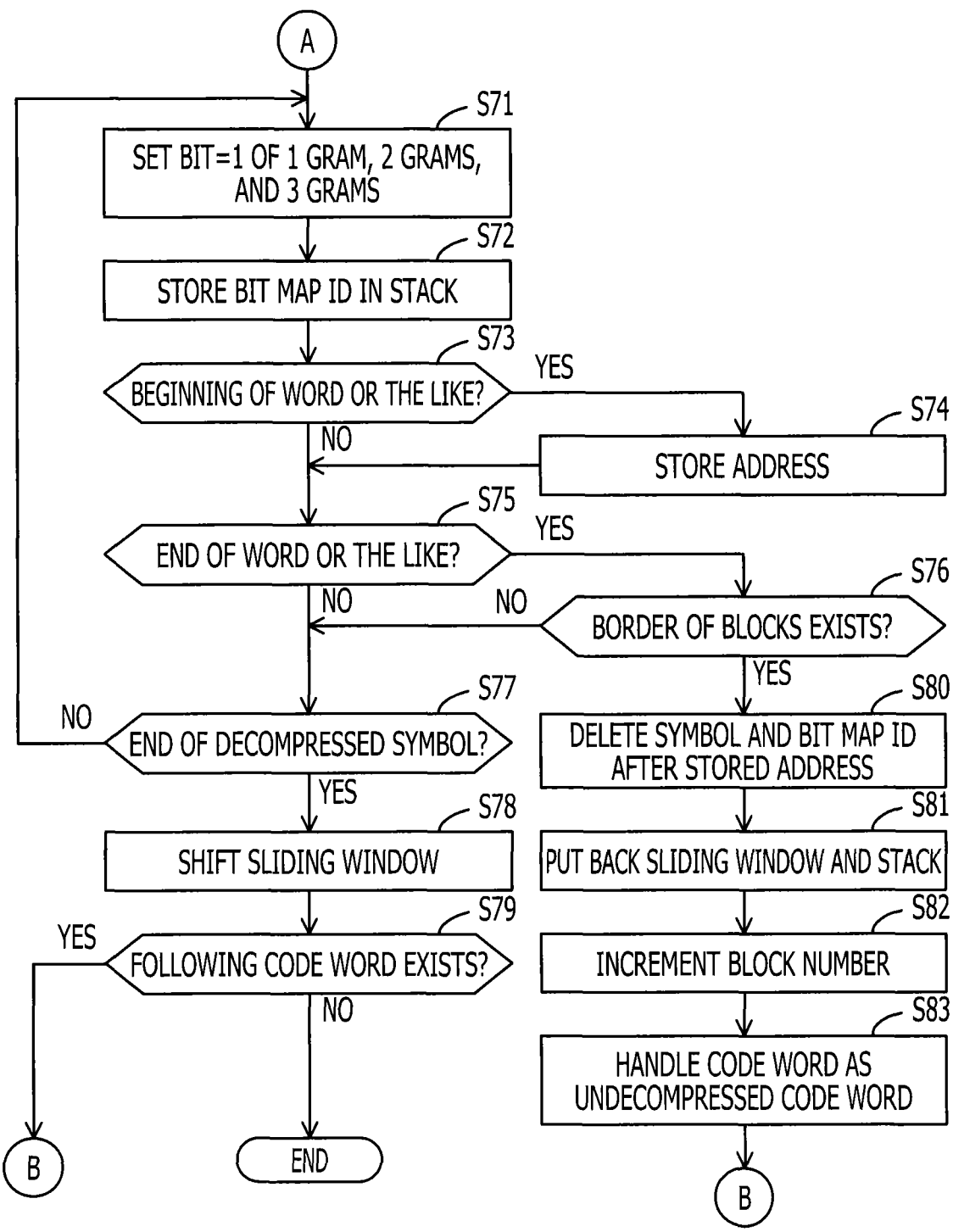
FIG. 23 is a flowchart illustrating the second procedure example of the file decompression.

FIG. 23 is a flowchart illustrating a second procedure of the file decompression. Instead of the processing according to the second embodiment illustrated in the flowchart in FIG. 11, the processing of the flowchart illustrated in FIG. 23 is performed after the processing of the flowchart illustrated in FIG. 10.

(S71) The decompressing unit 132 selects a single bit map ID in order starting from the bit map ID closer to the beginning thereof from among one or more bit map IDs obtained in S13 or S18. Based on the selected bit map ID, the preceding bit map ID stored in the stack 123, and the second preceding bit map ID stored in the stack 123, the decompressing unit 132 selects the bit map of 1 gram, 2 grams, and 3 grams from the index 124. The decompressing unit 132 sets the bit corresponding to the block that is currently decompressing and included in the selected bit grams of 1 gram, 2 grams, and 3 grams.

(S72) The decompressing unit 132 changes the preceding bit map ID stored in the stack 123 into the second preceding bit map ID and then stores this bit map selected in S71 in the stack 123 as the preceding bit map ID.

(S73) The decompressing unit 132 determines whether the symbol corresponding to the bit map ID selected in S71 is the beginning of a prescribed unit such as a word. For example, if the decompressed symbol string is an English text, the decompressing unit 132 determines that the symbol is the beginning of the word by detecting a previous space. If the decompressed symbol string is a Japanese text, the decompressing unit 132 determines that the symbol is the beginning of a text or a phrase by detecting a previous punctuation mark. If the symbol is the beginning of the prescribed unit, the process goes to S74. If not, the process goes to S75.

(S74) The decompressing unit 132 stores the address indicating the position of the symbol corresponding to the bit map ID selected in S71. (S75) The decompressing unit 132 determines whether the end of the prescribed unit such as a word exists before the symbol corresponding to the bit map ID selected in S71. For example, the decompressed symbol string is an English text, the decompressing unit 132 determines that the previous symbol is the end of a word by detecting a space. If the decompressed symbol string is a Japanese text, the decompressing unit 132 determines that that the previous symbol is the end of a text or a phrase by detecting a punctuation mark. If the previous symbol is the end of the prescribed unit, the process goes to S76. If not, the process goes to S77.

(S76) The decompressing unit 132 determines whether the symbol string of a prescribed unit such as a word straddles the blocks, that is, whether there is a border of the blocks between the address stored in S74 and the address of the end detected in S75. If the symbol string straddles the blocks, the process goes to S80. If not, the process goes to S77.

(S77) In S71, the decompressing unit 132 determines whether one or more bit map IDs obtained in S13 or S18 are all selected (whether the end of the string of the obtained bit map ID is selected). If all the bit map IDs are selected, the process goes to Operation 78. If not, the process goes to S71.

(S78) The decompressing unit 132 shifts the position of the sliding window backwards to the number of the symbols added to the buffer 121 in S14 or S18. (S79) The decompressing unit 132 determines whether the code word unit has a following code word. If yes, the process goes to S12. If no, the process ends.

(S80) The decompressing unit 132 deletes, from the buffer 121, the symbol string (for example, the last word) following the address stored in S74. The decompressing unit 132 further deletes the string of the bit map ID corresponding to the deleted symbol string.

(S81) While deleting the symbol string and the bit map ID in S80, the decompressing unit 132 puts the state of the sliding window and the stack back to the state before the decompression of the deleted symbol string. That is, the decompressing unit 132 shifts the sliding window forwards to the number of the symbols deleted from the buffer 121. The decompressing unit 132 stores two bit map IDs, which are stored in the end of the buffer 122 after the deletion in S80, in the stack 123 as the preceding bit map ID and the second preceding bit map ID.

(S82) The decompressing unit 132 increments the block number indicating the position of the bit as an update target in each bit map included in the index 124. (S83) The decompressing unit 132 assumes that the decompression is not completed on the code word corresponding to the symbol string deleted in S80, so that the process goes to S12. In this manner, regarding the symbol string of a prescribed unit straddling two blocks (for example, a word), the decompressing unit 132 handles the symbol string as the symbol string belonging to both the two blocks by decompressing the symbol string two times. The decompressing unit 132 updates the index 124 where the entire symbol string belongs to the preceding block. After that, the decompressing unit 132 updates the index 124 where the entire symbol string belongs to the latter block as well.

Figure 24:
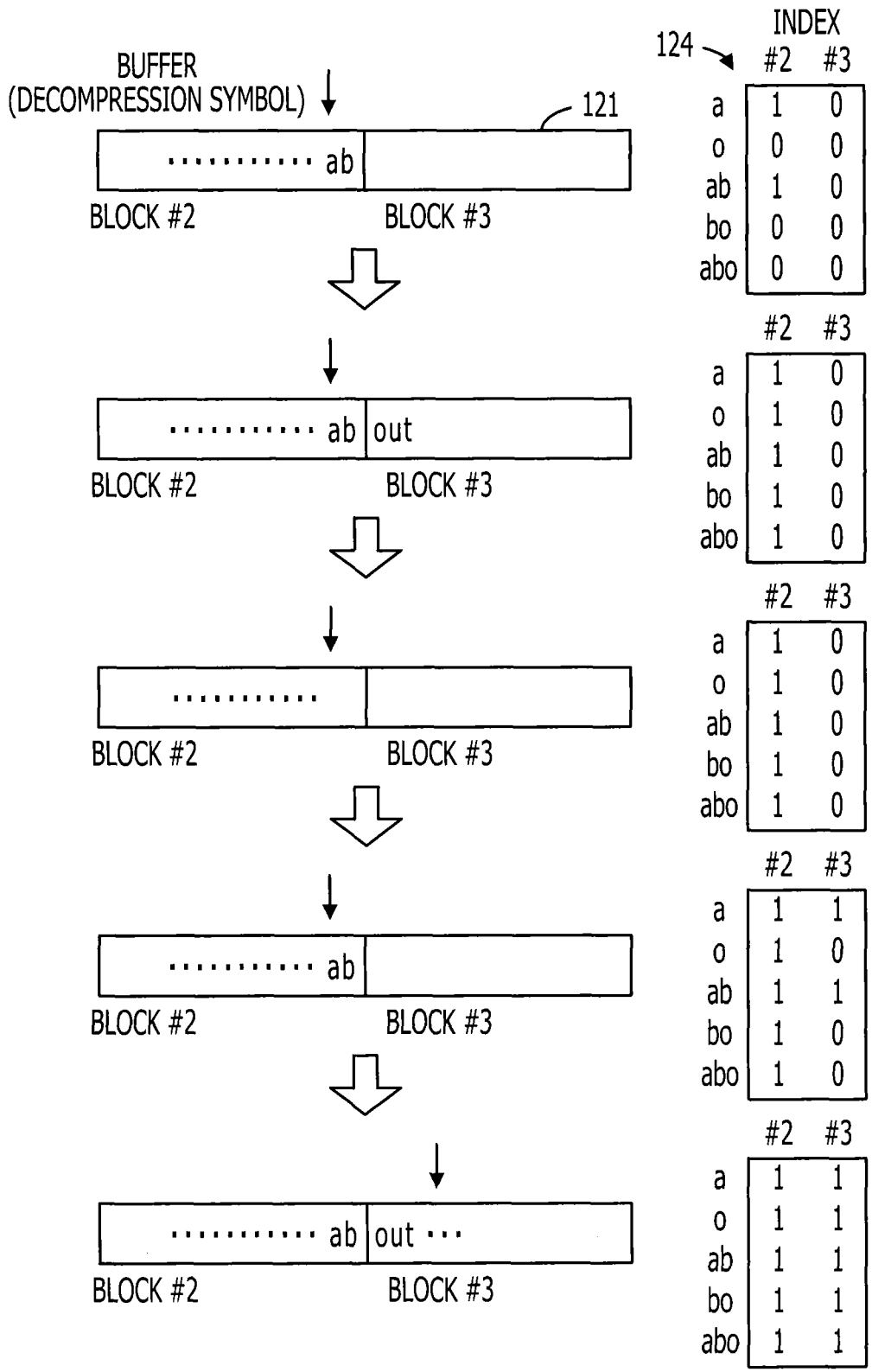
FIG. 24 illustrates an index generation example at a block border.

FIG. 24 is a diagram illustrating an index generation example at a block border. The example illustrated in FIG. 24 has an example of a case where the first two letters in the five letters forming an English word "about" are included in a block #2, and the latter three letters are included in a block #3.

When the first two characters "ab" are decompressed, the bit corresponding to the block #2 in the bit map corresponding to 1 gram "a" or 2 grams "oh" is set to "1" in the index 124. When the latter three letters "out" are decompressed, it is considered that the block is not switched. In the index 124, the bit corresponding to the block #2 in the bit map corresponding to 1 gram "o," 2 grams "bo," or 3 grams "abo" is set to "1." At this point, the bit corresponding to the block #3 is not updated.

When the first decompression of the English word "about" is completed, the word is deleted from the buffer 121. It is considered that the block is switched from the block #2 to the block #3. When the first two letters "ab" is again decompressed, the bit corresponding to the block #3 in the bit map corresponding to 1 gram "a" or 2 grams "ab" is set to "1" in the index 124. When the latter three letters "out" is again decompressed, the bit corresponding to the block #3 in the bit map corresponding to 1 gram "o", 2 grams "bo," or 3 grams "abo" is set to "1" in the index 124.

In this manner, the English word "about" straddling the blocks #2 and #3 are considered to belong to both the blocks #2 and #3, so that the index 124 is generated. Due to this, when the user specifies "about" as a keyword, the blocks #2 and #3 may be retrieved. The method for decompressing the symbol string, which straddles two blocks, two times illustrated in FIGS. 23 and 24 is an example of the method for generating the index 124 where the symbol string belongs to both the two blocks. The index 124 may be generated by other methods. The symbol string straddling two blocks may be considered to belong to one of the two blocks.

The information terminal device according to the fourth embodiment may achieve the advantages equivalent to the second embodiment. According to the fourth embodiment, even if the keyword specified by the user straddles two blocks, the position in which the keyword appears. This prevents detection failure.

As described above, the information processing according to the first embodiment may be achieved if the information processing device 19 executes the program. The information processing according to the second, third, and fourth embodiments may be achieved if the information terminal device 100 executes the program. The program may be recorded in a computer-readable recording medium (for example, the recording medium 21). A magnetic disk, an optical disk, an optical magnetic disk, a semiconductor memory, and the like may be used as a recording medium. An FD and an HDD may be used as a magnetic disk. A CD, a CD-R (Recordable)/RW (Rewritable), a DVD, a DVD-R/RW may be used as an optical disk.

To distribute the program, for example, a portable recoding medium that records the program is provided. The program may be stored in a storage device of another computer, so that the program may be distributed through a network. For example, the computer stores, in the recording device (for example, the non-volatile memory 103), the program recorded in the portable recording medium or the program received from another computer, loads the program from the storage device, and executes the program. However, the program loaded from the portable recording medium may be directly executed, and the program received through the network from another computer may be directly executed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

What is claimed is:

1. A decompression method comprising:
    accessing a dictionary data in association with a compression code included in a block of compressed data, the dictionary data including a decompressed symbol corresponding to the compression code and an address information indicating a position of a first flag stored in an index, the first flag indicating whether the symbol is included in a block of decompressed data, the decompressed data is obtained by decompressing the block of compressed data, the first flag and the address information being associated with each other in the index;
    obtaining, from the dictionary data, the decompression symbol and the address information associated with the compression code included in the block of compressed data, using a processor;
    generating the index corresponding to the decompressed data while generating the decompressed data by using the obtained decompression symbol;
    registering the generated index in an index file;
    updating the first flag in the index indicated by the obtained address information, wherein the first flag and a second flag are included in the index, the second flag indicating whether a symbol string including N decompression symbols is included in the block of decompressed data, the N is an integer of two or more,
    storing, a plurality of address information in a storage, each of the plurality of address information corresponding to one of a plurality of nearest N−1 symbols of which the decompression from the compressed data is completed; and
    when the address information for the compression code is obtained from the dictionary data, updating the second flag in the index based on the obtained address information and the plurality of address information stored in the storage,
    wherein the second flag corresponding to the symbol strings includes flags each of which indicates whether each of a first block and a second block includes the symbol string, and wherein the updating of the second flag includes:
    when a boundary of the first block and the second block is among the symbol string, updating the second flag corresponding to the symbol string so as to indicate that the symbol string is included in the first block and the second block.

2. The decompression method according to claim 1, wherein
    the decompression symbol and the address information are associated with the compression symbol in the dictionary data based on an address that is included in the compression code and indicates a position of a symbol, which is the same as a decompression symbol corresponding to the compression code, in the decompression data.

3. The decompression method according to claim 1, wherein
    the first flag corresponding to the decompression symbol includes flags each of which indicates whether each of blocks, in which the decompressed data is divided, includes the decompression symbol or not, and wherein the decompressed data is divided in the blocks based on a type of the compressed data.

4. A non-transitory computer-readable recording medium storing a decompression program that causes a computer to execute a procedure, the procedure comprising:
   accessing a dictionary data, in association with a compression code included in a block of compressed data, the dictionary data including a decompression symbol corresponding to the compression code and an address information indicating a position of a first flag stored in an index, the first flag indicating whether the decompression symbol is included in a block of decompressed data, the decompressed data is obtained by decompressing the block of compressed data, the first flag and the address information being associated with each other in the index;
   obtaining, from the dictionary data, the decompression symbol and the address information associated with the compression code included in the block of compressed data;
   generating the index corresponding to the decompressed data while generating the decompressed data by using the obtained decompression symbol;
   registering the generated index in an index file;
   updating the first flag in the index indicated by the obtained address information, wherein the first flag and a second flag are included in the index, the second flag indicating whether a symbol string including N decompression symbols is included in the block of decompressed data, the N is an integer of two or more,
   storing, a plurality of address information in a storage, each of the plurality of address information corresponding to one of a plurality of nearest N-1 symbols of which the decompression from the compressed data is completed; and
   when the address information for the compression code is obtained from the dictionary data, updating the second flag in the index based on the obtained address information and the plurality of address information stored in the storage,
   wherein the second flag corresponding to the symbol strings includes flags each of which indicates whether each of a first block and a second block includes the symbol string, and wherein the updating of the second flag includes:
   when a boundary of the first block and the second block is among the symbol string, updating the second flag corresponding to the symbol string so as to indicate that the symbol string is included in the first block and the second block.

5. The non-transitory recording medium according to claim 4, wherein
   the decompression symbol and the address information are associated with the compression symbol in the dictionary data based on an address that is included in the compression code and indicates a position of a symbol, which is the same as a decompression symbol corresponding to the compression code, in the decompression data.

6. The non-transitory recording medium according to claim 4, wherein
   the first flag corresponding to the decompression symbol includes flags each of which indicates whether each of blocks, in which the decompressed data is divided, includes the decompression symbol or not, and wherein the decompressed data is divided in the blocks based on a type of the compressed data.

7. A decompression apparatus comprising:
   a memory;
   a dictionary data stored in the memory; and
   a processor configured to execute a procedure, the procedure including:
      accessing the dictionary data stored in the memory in association with a compression code included in a block of compressed data, the dictionary data including a decompression symbol corresponding to the compression code and an address information indicating a position of a first flag stored in an index, the first flag indicating whether the decompression symbol is included in a block of decompressed data, the decompressed data is obtained by decompressing the block of compressed data, the first flag and the address information being associated with each other in the index;
      obtaining, from the dictionary data, the decompression symbol and the address information associated with the compression code included in the block of compressed data;
      generating the index corresponding to the decompressed data while generating the decompressed data by using the obtained decompression symbol;
      registering the generated index in an index file;
      updating the first flag in the index indicated by the obtained address information, wherein the first flag and a second flag are included in the index, the second flag indicating whether a symbol string including N decompression symbols is included in the block of decompressed data, the N is an integer of two or more,
      storing, a plurality of address information in a storage, each of the plurality of address information corresponding to one of a plurality of nearest N−1 symbols of which the decompression from the compressed data is completed; and
      when the address information for the compression code is obtained from the dictionary data, updating the second flag in the index based on the obtained address information and the plurality of address information stored in the storage,
      wherein the second flag corresponding to the symbol strings includes flags each of which indicates whether each of a first block and a second block includes the symbol string, and wherein the updating of the second flag includes:
      when a boundary of the first block and the second block is among the symbol string, updating the second flag corresponding to the symbol string so as to indicate that the symbol string is included in the first block and the second block.

8. The decompression apparatus according to claim 7, wherein
   the decompression symbol and the address information are associated with the compression symbol in the dictionary data based on an address that is included in the compression code and indicates a position of a symbol, which in the same as a decompression symbol corresponding to the compression code, in the decompression data.

9. The decompression apparatus according to claim 7, wherein
   the first flag corresponding to the decompression symbol includes flags each of which indicates whether each of blocks, in which the decompression data is divided, includes the decompressed symbol or not, and wherein the decompressed data is divided in the blocks based on a type of the compressed data.

* * * * *